(12) United States Patent
Yamada et al.

(10) Patent No.: US 9,844,802 B2
(45) Date of Patent: Dec. 19, 2017

(54) PROCESS AND APPARATUS FOR CLEANING IMPRINTING MOLDS, AND PROCESS FOR MANUFACTURING IMPRINTING MOLDS

(71) Applicant: DAI NIPPON PRINTING CO., LTD., Tokyo (JP)

(72) Inventors: Noriko Yamada, Tokyo (JP); Akiko Amano, Tokyo (JP)

(73) Assignee: DAI NIPPON PRINTING CO., LTD., Tokyo (JP)

( * ) Notice: Subject to any disclaimer, the term of this patent is extended or adjusted under 35 U.S.C. 154(b) by 251 days.

(21) Appl. No.: 14/570,986

(22) Filed: Dec. 15, 2014

(65) Prior Publication Data

US 2015/0136173 A1     May 21, 2015

Related U.S. Application Data

(63) Continuation of application No. 13/640,387, filed as application No. PCT/JP2011/073750 on Oct. 7, 2011, now abandoned.

(30) Foreign Application Priority Data

Oct. 29, 2010   (JP) ................................ 2010-244032

(51) Int. Cl.
*G03F 7/00*     (2006.01)
*B08B 7/00*     (2006.01)
*B29C 33/72*    (2006.01)

(52) U.S. Cl.
CPC .......... *B08B 7/0057* (2013.01); *B08B 7/0035* (2013.01); *B29C 33/72* (2013.01); *B29C 2033/725* (2013.01)

(58) Field of Classification Search
CPC ........................... B08B 7/0035; B08B 7/0057
See application file for complete search history.

(56) References Cited

U.S. PATENT DOCUMENTS

| 5,279,771 A | 1/1994 | Lee |
| 5,583,285 A * | 12/1996 | Hahn ..................... G01N 13/02 73/64.52 |
| 8,052,797 B2 | 11/2011 | Ikuta |
| 2004/0087068 A1 | 5/2004 | Yudasaka |

(Continued)

FOREIGN PATENT DOCUMENTS

| JP | A-2008-207475 | 9/2008 |
| JP | A-2008-260173 | 10/2008 |
| TW | 2008-34706 A | 8/2008 |

OTHER PUBLICATIONS

Jul. 7, 2014 Office Action issued in Taiwan Application No. 100137728.

(Continued)

*Primary Examiner* — Matthew Daniels
(74) *Attorney, Agent, or Firm* — Oliff PLC

(57) ABSTRACT

The cleaning process of cleaning an imprinting mold including a release layer coupled via siloxane bonds to a substrate of that release layer includes a first cleaning step and a second cleaning step. In the first cleaning step, the angle of contact of the surface of the release layer with water is made small, and in the second cleaning step, the alkali cleaning agent is brought in contact with the release layer that has gone through the first cleaning step.

40 Claims, 11 Drawing Sheets

(56) References Cited

U.S. PATENT DOCUMENTS

| | | |
|---|---|---|
| 2008/0092918 A1 | 4/2008 | Ikuta |
| 2008/0131623 A1 | 6/2008 | Zhang et al. |
| 2010/0044921 A1* | 2/2010 | Ito .......................... B82Y 10/00 264/402 |

OTHER PUBLICATIONS

Mar. 14, 2013 Office Action issued in Korean Application No. 10-2012-7028429.

Lee, Dong-Il. "The Surface Treatment Effect for Nanoimprint Lithography Using Vapor Deposition of Silane Coupling Agent". vol. 45, No. 2, Apr. 2007, pp. 149-154.

Nam, Chul-Woo. "The Present and Future of CMP Technology". vol. 2, No. 3, 1999, pp. 11-24.

Srinivasan et al, "Alkyltrichlorosilane-Based Self-Assembled Monolayer Films for Stiction Reduction in Silicon Micromachines," Journal of Microelectromechanical Systems, vol. 70, No. 2 (Jun. 1998), pp. 252-260.

Zhou et al., "Characterization of anti-adhesive self-assembled monolayer for nanoimprint lithography," Applied Surface Science, vol. 255 (2008), pp. 2885-2889.

Bender et al., "Multiple imprinting in UV-based nanoimprint lithography: related material issues," Microelectronic Engineering, vol. 61-62 (2002), pp. 407-413.

* cited by examiner

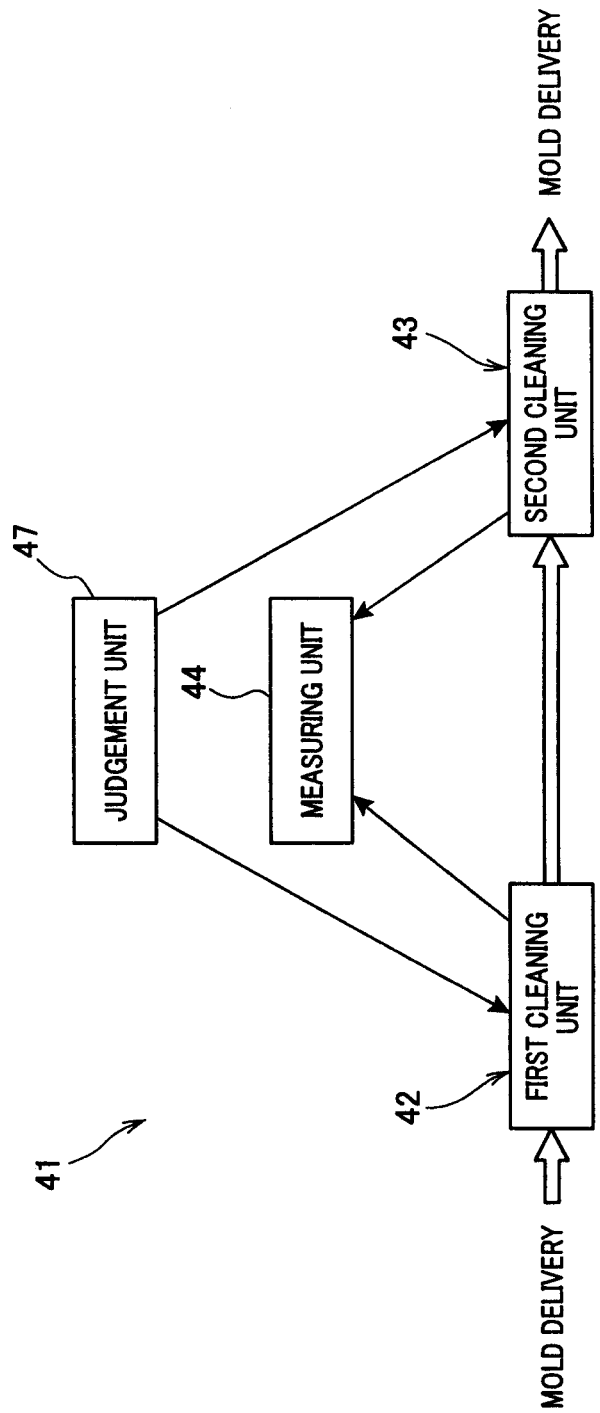

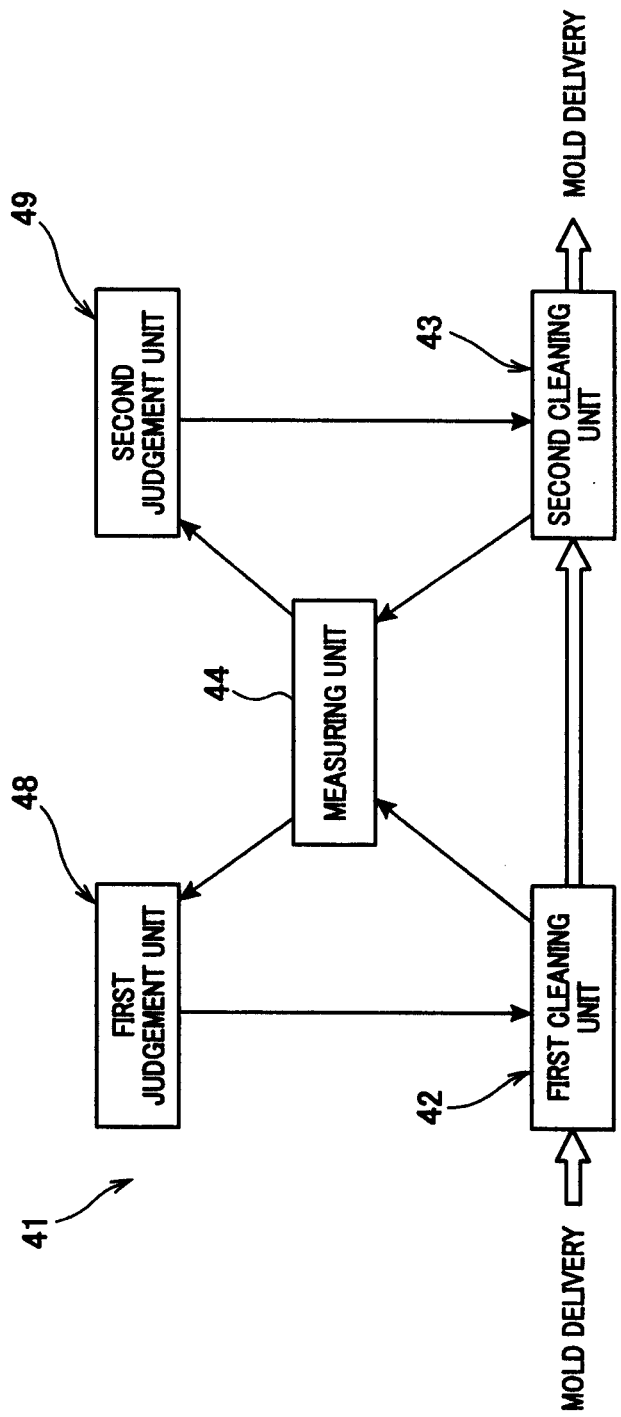

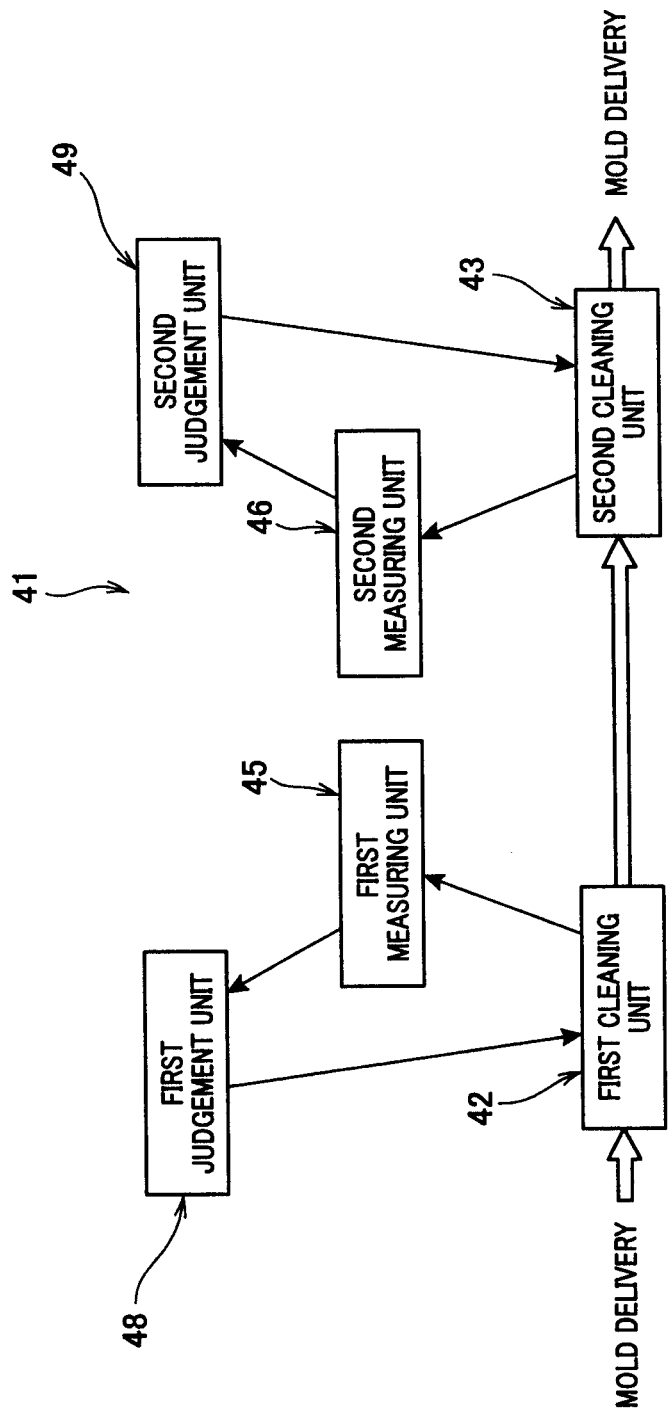

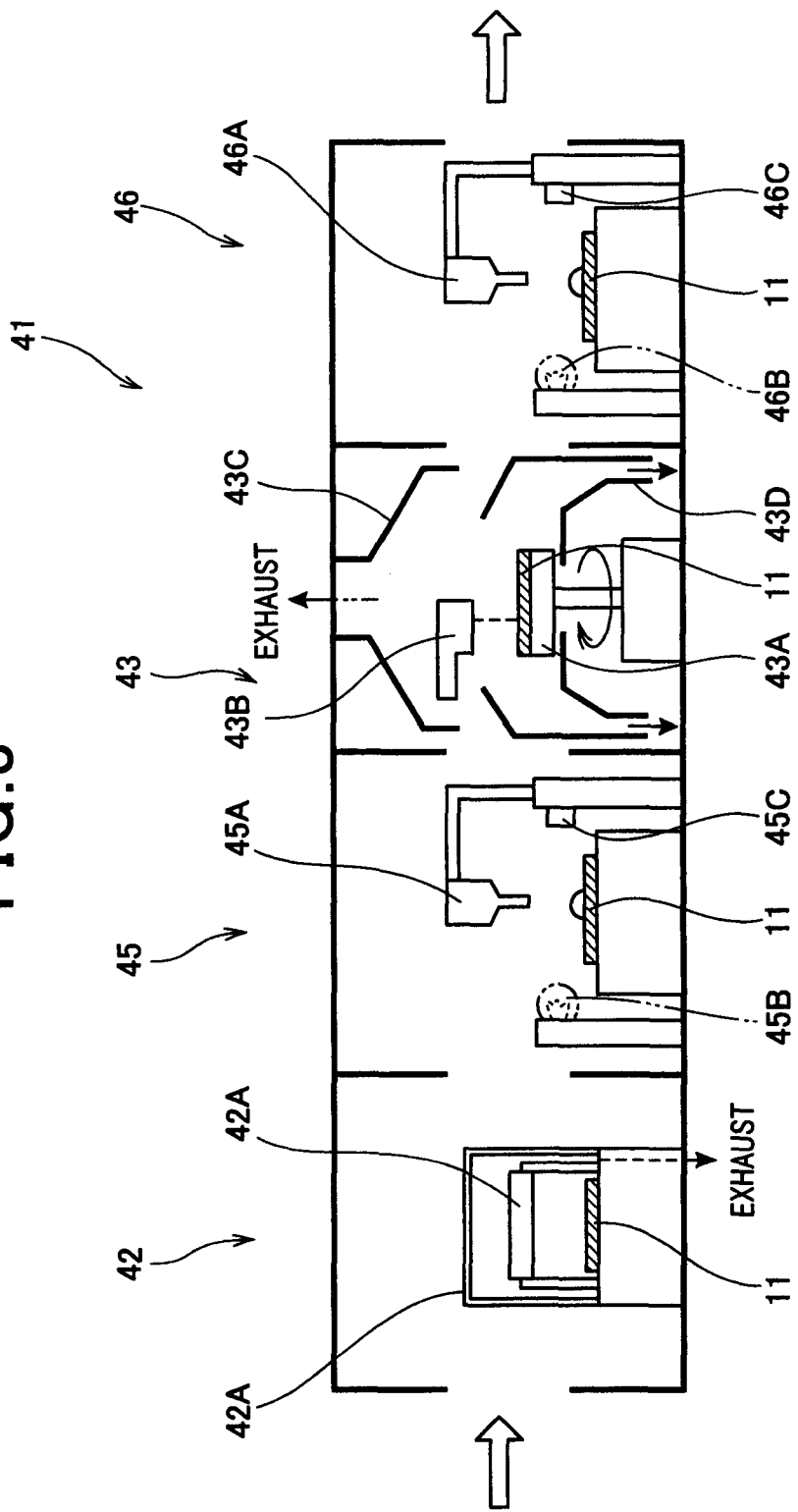

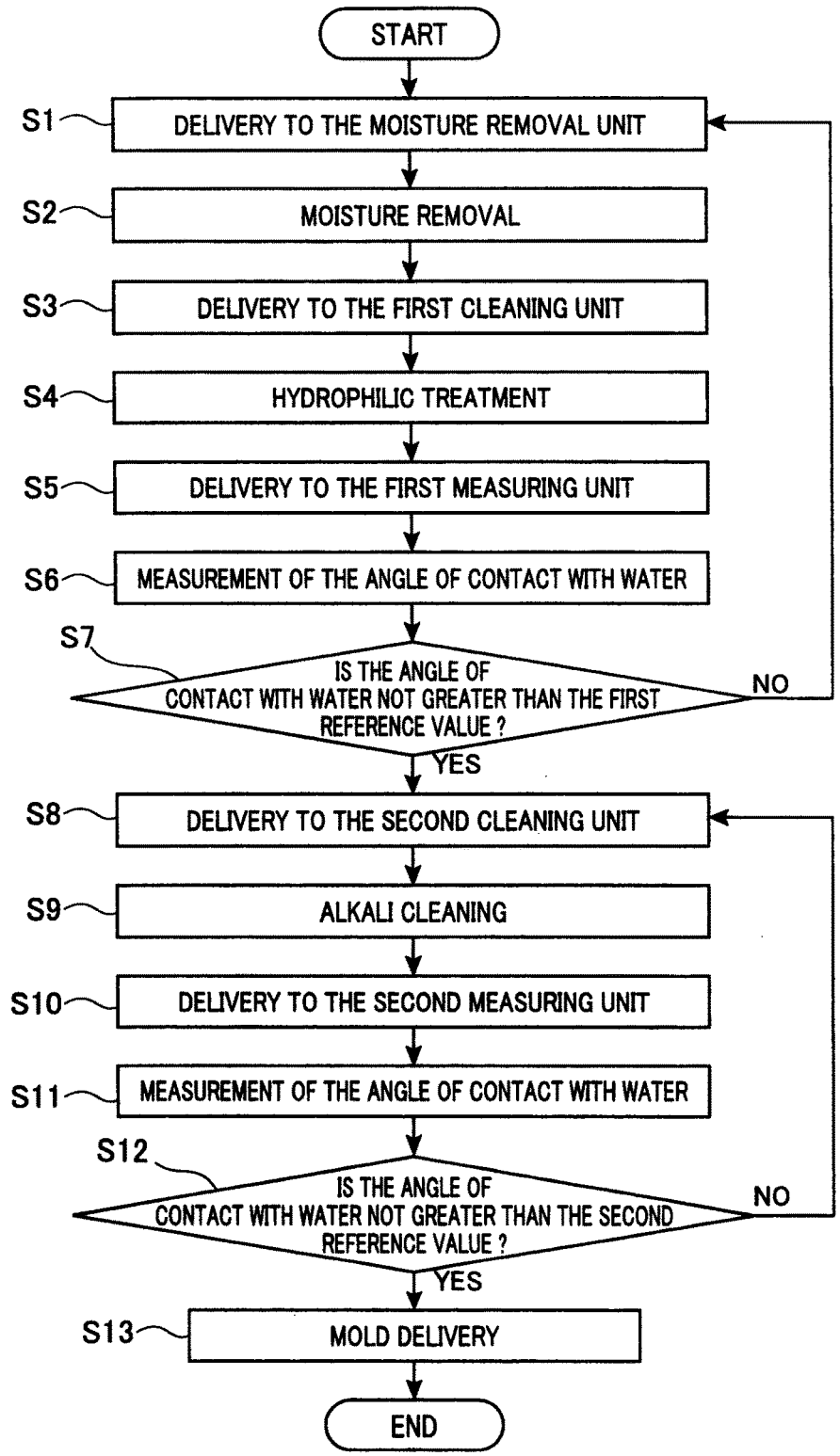

PROCESS AND APPARATUS FOR CLEANING IMPRINTING MOLDS, AND PROCESS FOR MANUFACTURING IMPRINTING MOLDS

CROSS REFERENCE TO RELATED APPLICATIONS

This application is a continuation application of U.S. patent application Ser. No. 13/640,387, filed Jan. 17, 2013, which is a U.S. national stage of PCT/JP2011/073750, filed Oct. 7, 2011. These prior applications are incorporated herein by reference in their entireties.

BACKGROUND OF THE INVENTION

Field of the Invention

The present invention relates to a process and apparatus for cleaning imprinting molds, and a process for manufacturing a mold using that cleaning process.

Description of the Prior Art

In recent years, attention has been directed to nanoimprint technology for microprocessing including nanoprocessing. Nanoimprint technology is a sort of pattern-formation technique wherein a mold member including a substrate having an uneven structure formed on its surface is used to transfer the uneven structure on the mold onto a workpiece thereby transferring the uneven structure in the equal size.

The aforesaid nanoimprint technology known in the art includes a photoimprint method and a thermal imprint method. In the photoimprint method, for instance, a photo-curable resin layer is formed as a workpiece on the surface of the substrate, and a mold having the desired uneven structure is pressed against the resin layer. In this state, the resin layer is irradiated with light from the mold side to cure the resin layer, after which the mold is pulled apart from the resin layer, whereby an uneven structure (uneven pattern) that is an inverted one of the uneven pattern the mold has can be formed on the resin layer that is the workpiece. In the thermal imprint method, the mold is pressed against the resin layer that is softened by heating, and the resin layer is then cooled down for curing, after which the resin layer is released from the mold.

For such an imprinting mold, there may be a copy mold used that is prepared as follows. For instance, a mask is formed on a substrate of quartz glass or silicon by means of electron beam lithography, and this mask is used to apply precise fine processing to a substrate of quartz glass or silicon by means of dry etching, thereby preparing a master mold. Then, this master mold is used to form a mask on a substrate of quartz glass or silicon by the imprint method, and this mask is used to apply precise fine processing to a substrate of quartz glass or silicon to prepare a copy mold (Patent Publication 1).

With imprinting molds inclusive of such master and copy molds, there may be deposition of the material to be patterned or the like during imprinting. To prevent this, a release agent such as a fluorine-based resin is coated on the surface to form a release layer thereby imparting releasability to it. However, a problem with such a release layer is that its releasability decreases with an increasing number of repetitive use of the mold; so there is some limitation on how often the mold is repetitively used or, in another parlance, the mold cannot stand up to thousands of repetitive use. For this reason, it has been proposed to treat a fluorine resin or other release layer that is formed on the mold by means of a cleaning agent or gas for its cleaning and removal, and then form a fresh release layer for the regeneration of the mold (Patent Publication 2).

LISTING OF THE PATENT PUBLICATIONS

Patent Publication 1: JP(A) 2008-207475
Patent Publication 2: JP(A) 2008-260173

SUMMARY OF THE INVENTION

Problems with the Prior Art

However, when a release layer formed using a fluoroalkyl- or alkyl-based silane coupling agent is cleaned by the process set forth in JP(A) 2008-260173, removal of the release layer is insufficient and some release layer is left unremoved from the mold, providing an obstacle to the formation of a fresh release layer. When an alkali-based cleaning agent is used, it is repelled because of the water repellency of the release layer, making it difficult for that cleaning agent to exert its cleaning action on the release layer, and taking much time for cleaning. A problem with a mold made up of a material less resistant to alkalis such as quartz glass or silicon is that it cannot be cleaned by a cleaning process using an alkali-based cleaning agent.

The situations being like this, an object of the invention is to provide a process and apparatus for cleaning an imprinting mold including a release layer bonded via siloxane bonds to a substrate, an imprinting mold having a wide margin for use conditions, and a process for manufacturing an imprinting mold including a release layer capable of exerting good release actions.

How to Solve the Problems are

The invention provides a cleaning process for cleaning an imprinting mold including a release layer coupled via siloxane bonds to a substrate of said imprinting mold, which comprises a first cleaning step of making small an angle of contact of the surface of said release layer with water, and a second cleaning step of bringing an alkali cleaning agent in contact with said release layer that has gone through said first cleaning step.

In one embodiment of the invention, said first cleaning step is such that the angle of contact of the surface of said release layer with water is not greater than 95°.

In another embodiment of the invention, said first cleaning step includes at least one step of a step of irradiating said release layer with light including a wavelength range of less than 190 nm, a step of irradiating said release layer with light including a wavelength range of 190 nm to 370 nm, a step of ashing said release layer, and a step of irradiating said release layer with electron radiation.

In yet another embodiment of the invention, the irradiation of said release layer with light including a wavelength range of less than 190 nm in said first cleaning step is implemented such that the dose of light including a wavelength range of less than 190 nm is within the range of 1 to 10,000 mJ/cm$^2$.

In a further embodiment of the invention, the irradiation of said release layer with light including a wavelength range of 190 nm to 370 nm in said first cleaning step is implemented such that the dose of light including a wavelength range of 190 nm to 370 nm is in the range of 1 to 100,000 mJ/cm$^2$.

In a further embodiment of the invention, the ashing applied to said release layer in said first cleaning step is implemented with at least one species of active radicals and ions.

In a further embodiment of the invention, the ashing applied to said release layer in said first cleaning step is implemented with at least one species of oxygen radicals, fluorine radicals, argon radicals, oxygen ions, fluorine ions, argon ions, and ozone.

In a further embodiment of the invention, the cleaning process comprises a moisture removal step prior to said first cleaning step.

The invention also provides a cleaning process for cleaning an imprinting mold including a release layer coupled via siloxane bonds to a substrate of said imprinting mold, which comprises a first cleaning step of cleaving water repellent groups contained in the surface of said release layer, and a second cleaning step of bringing an alkali cleaning agent in contact with said release layer that has gone through said first cleaning step.

In one embodiment of the invention, said first cleaning step includes at least one step of a step of irradiating said release layer with light including a wavelength range of less than 190 nm, a step of irradiating said release layer with light including a wavelength range of 190 nm to 370 nm, a step of applying ashing to said release layer, and a step of irradiating said release layer with electron radiation.

In another embodiment of the invention, the irradiation of said release layer with light including a wavelength range of less than 190 nm in said first cleaning step is implemented such that the dose of light including a wavelength range of less than 190 nm is within the range of 1 to 10,000 mJ/cm$^2$.

In yet another embodiment of the invention, the irradiation of said release layer with light including a wavelength range of 190 nm to 370 nm in said first cleaning step is implemented such that the dose of light including a wavelength range of 190 nm to 370 nm is in the range of 1 to 100,000 mJ/cm$^2$.

In a further embodiment of the invention, the ashing applied to said release layer in said first cleaning step is implemented with at least one species of active radicals and ions.

In a further embodiment of the invention, the ashing applied to said release layer in said first cleaning step is implemented with at least one species of oxygen radicals, fluorine radicals, argon radicals, oxygen ions, fluorine ions, argon ions, and ozone.

In a further embodiment of the invention, the cleaning process comprises a moisture removal step prior to said first cleaning step.

The invention further provides a cleaning apparatus for cleaning an imprinting mold including a release layer coupled via siloxane bonds to a substrate of said imprinting mold, which comprises a first cleaning unit of applying hydrophilic treatment to the surface of said release layer, a second cleaning unit of applying alkali cleaning to the imprinting mold to which the hydrophilic treatment has been applied in said first cleaning unit, at least one measuring unit of measuring the surface state of said imprinting mold, a first judgment unit of, based on the result of measurement in said measuring unit, judging whether or not the surface of said release layer to which the hydrophilic treatment has been applied in said first cleaning unit can be alkali-cleaned, and a second judgment unit of, based on the result of measurement in said measuring unit, judging whether or not said release layer is removed from the surface of the imprinting mold to which the alkali cleaning has been applied in said second cleaning unit.

In one embodiment of the invention, said first cleaning unit is operable to make small the angle of contact of the surface of said release layer with water, thereby implementing said hydrophilic treatment, said measuring unit is operable to measure the angle of contact with water, said first judgment unit is operable to judge alkali cleaning as being to be done when the angle of contact with water of the surface of said release layer to which the hydrophilic treatment has been applied in said first cleaning unit is not greater than a first reference value, and said second judgment unit is operable to judge said release layer as being removed when the angle of contact with water of the surface of the imprinting mold to which the alkali cleaning has been applied in said second cleaning unit is not greater than a second reference value set less than said first reference value.

In one embodiment of the invention, said first cleaning unit includes a light source for implementing irradiation of the surface of said release layer with light, wherein light irradiated out of said light source includes light having a wavelength range of less than 190 nm.

In another embodiment of the invention, said first cleaning unit includes a light source for implementing irradiation of the surface of said release layer with light, wherein light irradiated out of said light source includes light having a wavelength range of 190 nm to 370 nm.

In yet another embodiment of the invention, said first cleaning unit includes a treatment device for applying asking to the surface of said release layer.

In a further embodiment of the invention, said first cleaning unit includes a device for irradiating the surface of said release layer with electron radiation.

In a further embodiment of the invention, said first reference value is 95°, and said second reference value is an angle that is 2° larger than the angle of contact of said substrate with water before the formation of said release layer.

In a further embodiment of the invention, said measuring unit includes a first measuring unit operable to measure the angle of contact with water of the surface of said release layer to which the hydrophilic treatment has been applied in the first cleaning unit, and a second measuring unit operable to measure the angle of contact with water of the surface of the imprinting mold to which the alkali cleaning has been applied in the second cleaning unit, wherein while the angle of contact of the surface of the release layer with water is measured in the first measuring unit, the hydrophilic treatment is applied to the surface of said release layer in said first cleaning unit.

The invention further provides a process for manufacturing an imprinting mold comprising a substrate, an uneven structure positioned on one surface of said substrate, and a release layer coupled via siloxane bonds to said substrate in such a way as to cover at least said uneven structure, which comprises a first cleaning step of making hydrophilic the surface of said release layer, and a second cleaning step of brining an alkali cleaning agent in contact with said release layer that has gone through said first cleaning step to expose said substrate covered with said release layer.

The invention further provides a process for manufacturing an imprinting mold comprising a substrate, an uneven structure positioned on one surface of said substrate, and a release layer coupled via siloxane bonds to said substrate in such a way as to cover at least said uneven structure, which comprises a cleaning step of removing said release layer, and a reformation step of forming a fresh release layer coupled via siloxane bonds to said substrate in such a way as to cover at least said uneven structure, wherein said cleaning step comprises a first cleaning step of making small the angle of contact of the surface of said release layer with water, and a second cleaning step of bringing an alkali cleaning agent in contact with said release layer that have gone through said first cleaning step.

In one embodiment of the invention, a fluoroalkyl- or alkyl-based silane coupling agent is used in said reformation step to form a fresh release layer.

In another embodiment of the invention, the fresh release layer formed in said reformation step has a thickness of 0.3 to 100 nm.

The invention further provides a process for manufacturing an imprinting mold comprising a substrate, an uneven structure positioned on one surface of said substrate, and a release layer coupled via siloxane bonds to said substrate in such a way as to cover at least said uneven structure, which comprises a cleaning step of removing said release layer, and a reformation step of forming a fresh release layer coupled via siloxane bonds to said substrate in such a way as to cover at least said uneven structure, wherein said cleaning step comprises a first cleaning step of cleaving water repellent groups contained in the surface of said release layer, and a second cleaning step of bringing an alkali cleaning agent in contact with said release layer that has gone through said first cleaning step.

In one embodiment of the invention, a fluoroalkyl- or alkyl-based silane coupling agent is used in said reformation step to form a fresh release layer.

In another embodiment of the invention, the fresh release layer formed in said reformation step has a thickness of 0.3 to 100 nm.

Advantages of the Invention

In the first cleaning step of the imprinting mold cleaning process according to the invention, the angle of contact of the surface of the release layer with water is made small or the water repellent groups contained in the surface of the release layer are cleaved so that in the next second cleaning step using the alkali cleaning agent, the repelling of the alkali cleaning agent by the release layer is reduced, facilitating exertion of the cleaning action of the alkali cleaning agent on the release layer, and cleaving the siloxane bonds that has a function of holding the release layer in close contact with the mold. Such first and second cleaning steps combined makes sure good cleaning action on the release layer. In addition, the time taken in the second cleaning step using the alkali cleaning agent is by far shorter than could be achieved with a cleaning process using an alkali cleaning agent alone, and even molds made of materials poor in alkali resistance such as quartz glass or silicon are cleanable, resulting in a merit: there is no limitation on the molds to be cleaned.

The imprinting mold cleaning apparatus according to the invention ensures removal by cleaning of the release layer coupled via siloxane bonds to the substrate of the imprinting mold, and has the capability of cleaning even molds made of materials poor in alkali resistance such as quartz glass or silicon as well.

With the process for manufacturing imprinting molds according to the invention, it is possible to manufacture a mold with the substrate exposed, because the surface of the release layer is made hydrophilic in the first cleaning step, and the siloxane bonds are cleft by the alkali cleaning agent for removal of the release layer in the next second cleaning step. Accordingly, the resultant mold may be used with the substrate left exposed or, alternatively, with the desired processing applied to the surface of the substrate, depending on what purpose it is used for, the material of the workpiece, etc. In other words, it is possible to manufacture a mold usable under diverse conditions in a wide range of applications. In addition, it is possible to achieve some considerable reductions in the manufacturing cost of molds and the cost taken for imprint using molds as well.

Further with the process for manufacturing imprinting molds according to the invention, the mold is cleaned of the release layer with reliability, after which a fresh release layer is reformed to prepare a mold, making sure the reformed release layer is free of defects, etc. In other words, it is possible to regenerate a mold whose release layer decreases in releasability because of repetitive use, thereby manufacturing a mold including a release layer having good releasability. The process for manufacturing imprinting molds according to the invention also ensures that the cycles of repetitive use of molds can be much more increased; for instance, if the mold is a master one, some considerable reductions would then be achievable in the manufacturing cost of copy molds, and if the mold is a copy one, some considerable reductions would then be achievable in the cost taken for imprint using molds.

BRIEF DESCRIPTION OF THE DRAWING

FIG. 5 is illustrative of one example of the basic construction of the imprinting mold cleaning apparatus according to the invention.

FIG. 6 is illustrative of another example of the basic construction of the imprinting mold cleaning apparatus according to the invention.

FIG. 7 is illustrative of yet another example of the basic construction of the imprinting mold cleaning apparatus according to the invention.

FIG. 8 is illustrative in construction of one embodiment of the imprinting mold cleaning apparatus according to the invention.

FIG. 9 is a flowchart for the cleaning treatment implemented by the imprinting mold cleaning apparatus according to the invention.

MODES FOR CARRYING OUT THE INVENTION

Embodiments of the invention will now be explained with reference to the accompanying drawing.

Imprinting Mold Cleaning Process

The process for cleaning imprinting molds according to the invention comprises the first and second cleaning steps. In the first cleaning step, the angle of contact with water of the surface of the release layer formed on the mold is made small, or water repellent groups contained in the release layer are cleft. In the following second cleaning step, an alkali cleaning agent is then brought in contact with the release layer that has gone through the first cleaning step, thereby removing the release layer from the mold.

Figure 1:
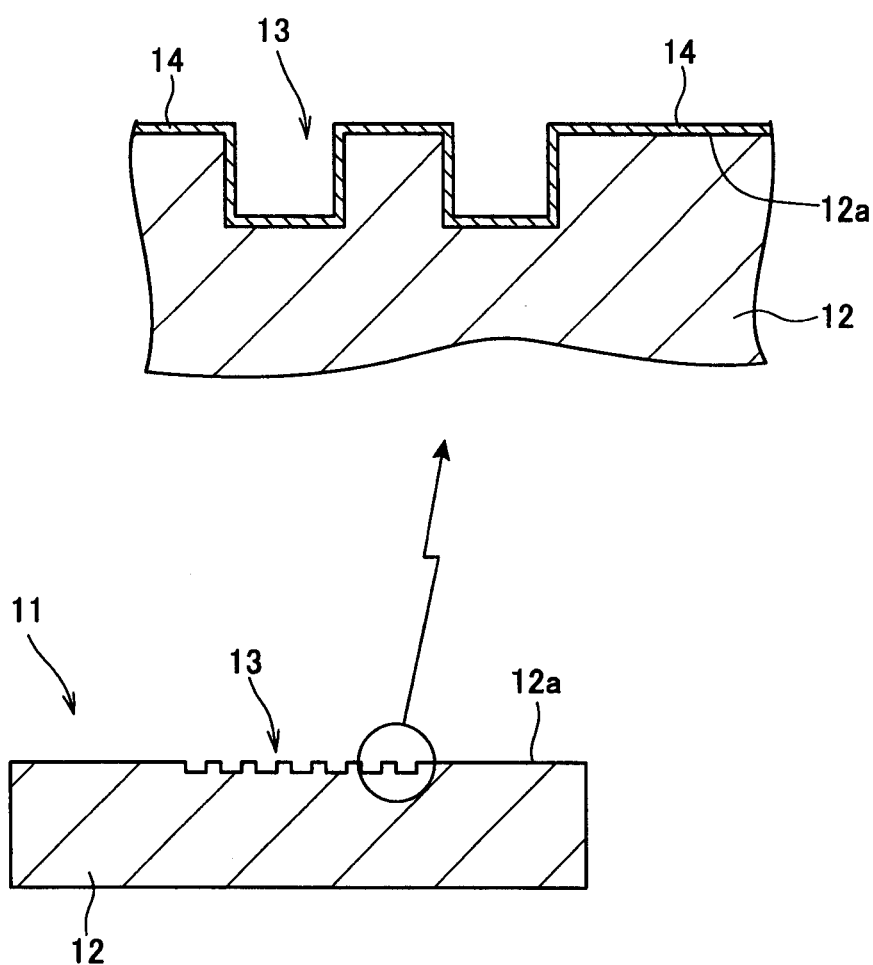
FIG. 1 is illustrative in section of one example of the imprinting mold to which the inventive cleaning process may be applied.
Figure 2:
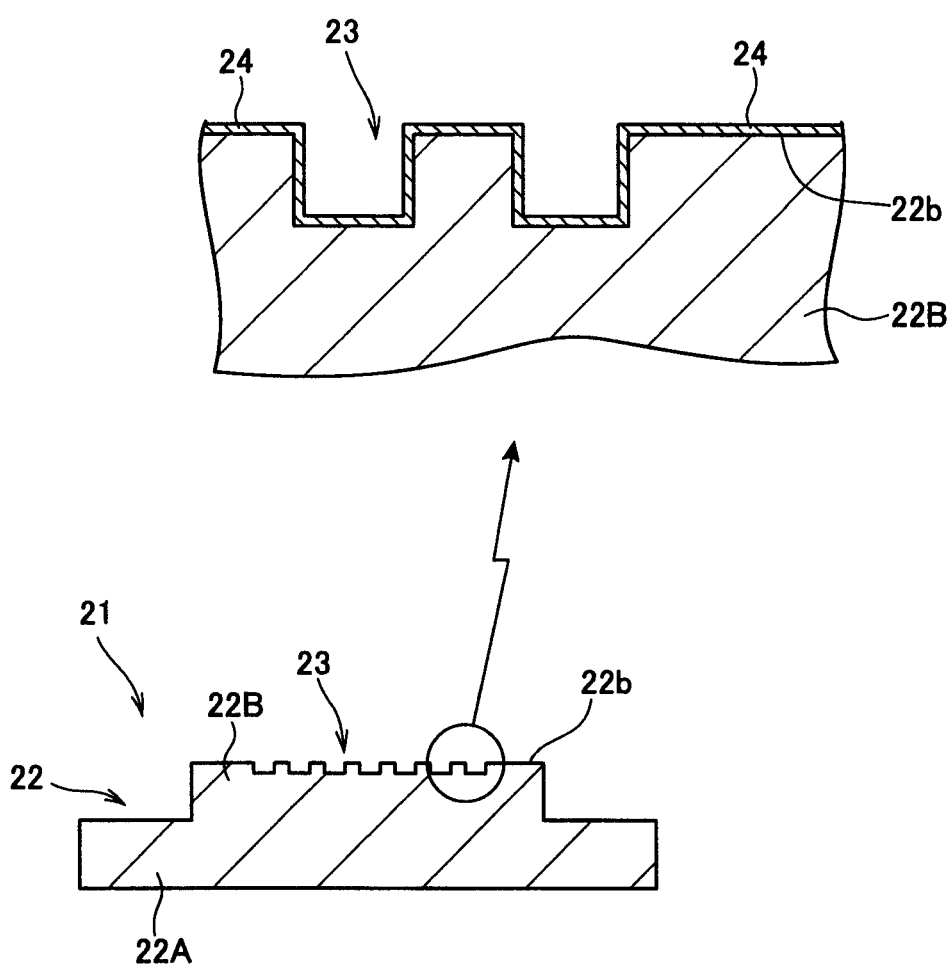
FIG. 2 is illustrative in section of another example of the imprinting mold to which the inventive cleaning process may be applied.

There is no specific limitation on the imprinting molds to be cleaned according to the invention; as shown in FIG. 1 as an example, a mold 11 may be made up of a substrate 12, an uneven structure 13 positioned on one surface 12$a$ of the substrate 12, and a release layer 14 formed in such a way as to cover at least the uneven structure 13 (in FIG. 1, the release layer 14 is shown to cover all over one surface 12$a$). Alternatively, there may be a mold 21 used, comprising a substrate 22 having a base portion 22A from which a convex portion 22B projects, an uneven structure 23 provided on a plane 22$b$ that defines the top of the convex portion 22B of the substrate 22, and a release layer 24 formed in such a way as to cover the uneven structure 23 (in FIG. 2, the release layer 24 is shown to cover all over the plane 22$b$ of the convex portion 22), as shown in FIG. 2.

Materials for the substrate 12, 22 of the mold 11, 21 may be semiconductor materials such as silicon, glasses such as quartz glass, silicate-based glass, calcium fluoride, magnesium fluoride and acrylic glass, metals such as nickel, aluminum, titanium, copper, chromium, iron, cobalt and tungsten, alloys of these metals with nonmetals such as carbon and silicon, laminates comprising any of these materials, or carbonaceous materials such as glassy carbons. The uneven structure 13, 23 may be configured in the desired concave shape relative to one surface 12$a$, plane 22$b$, in the desired convex shape relative to one surface 12$a$, plane 22$b$, in the desired concavo-convex shape relative to one surface 12$a$, plane 22$b$, or in the desired concave and/or convex shape relative to one surface 12$a$, plane 22$b$, with a flat surface of the desired shape. The width and depth of each concave portion and the width and height of each convex portion in the uneven structure may optionally be set within the range of a few tens of nanometers to a few millimeters depending on the pattern to be formed by imprinting (lines if desired, patterns if desired, planar shape if desired, etc.).

The release layer 14, 24 to be cleaned according to the invention is the one that is coupled via siloxane bonds to the substrate of the mold, for instance, a release layer formed using a silane coupling agent. Such a silane coupling agent is capable of forming a release layer having such a structure just as an organic substance area containing water repellent groups is coupled via siloxane bonds to the mold, and typically includes a fluoroalkyl-based one, and an alkyl-based one.

Specifically, the fluoroalkyl-based silane coupling agent includes:

$C_4F_9(OC_3F_6)_nC_3F_6Si(OCH_3)_3$
$CF_3(CF_2)_n(CH_2)_2Si(OCH_2CH_3)_3$
$CF_3(CF_2)_n(CH_2)_2Si(OCH_3)_3$
$CF_3(CF_2)_n(CH_2)_2SiCl_3$
$CF_3(CH_2)_2Si(OCH_2CH_3)_3$
$CF_3(CH_2)_2Si(OCH_3)_3$
$CF_3(CH_2)_2Si(CH_3)_2Cl$
$C_4F_9(OC_3F_6)_nC_3F_7Si(CH_3)(OCH_3)_2$
$CF_3(CF_2)_n(CH_2)_2Si(CH_3)(OCH_2CH_3)_2$
$CF_3(CF_2)_n(CH_2)_2Si(CH_3)(OCH_3)_2$
$CF_3(CF_2)_n(CH_2)_2Si(CH_3)Cl_2$
$CF_3(CH_2)_2Si(CH_3)(OCH_2CH_3)_2$
$CF_3(CH_2)_2Si(CH_3)(OCH_3)_2$
$CF_3(CH_2)_2Si(CH_3)Cl_2$
$C_4F_9(OC_3F_6)_nC_3F_6Si(CH_3)_2(OCH_3)$
$CF_3(CF_2)_n(CH_2)_2Si(CH_3)_2(OCH_2CH_3)$
$CF_3(CF_2)_n(CH_2)_2Si(CH_3)_2(OCH_3)$
$CF_3(CF_2)_n(CH_2)_2Si(CH_3)_2Cl$
$CF_3(CH_2)_2Si(CH_3)_2(OCH_2CH_3)$
$CF_3(CH_2)_2Si(CH_3)_2(OCH_3)$
$CF_3(CH_2)_2Si(CH_3)_2Cl$
$CF_3(CF_2)_n(C_6H_4)(CH_2)_2Si(OCH_3)_3$
$CF_3(CH_2)_n(C_6H_4)Si(OCH_3)_3$
$CF_3(CH_2)(C_6H_4)_2(CH_2)_nSi(CH_2)_2(OCH_3)_3$ $$[(CH_3O)_3Si(CH_2)_3\overset{\underset{|}{(CH_2)_nH}}{N^+}(CH_2)_3Si(OCH_3)_3]Br^-$$
$$\underset{CH^3}{|}$$

In the formulae as listed above, n is an integer of 1 or greater.

Specifically, the alkyl-based silane coupling agent includes:

$CH_3(CH_2)_nSi(OCH_2CH_3)_3$
$CH_3(CH_2)_nSi(OCH_3)_3$
$CH_3(CH_2)_nSiCl_3$
$(CH_3)_3Si(NH) Si(CH_3)_3$
$(C_2H_5)_3Si(NH) Si(CH_3)_3$
$CH_3(CH_2)_nSi(CH_3)(OCH_2CH_3)_2$
$CH_3(CH_2)_nSi(CH_3)(OCH_3)_2$
$CH_3(CH_2)_nSi(CH_3)Cl_2$
$(CH_3)_3Si(NH) Si(CH_3)(CH_3)_2$
$(C_2H_5)_3Si(NH) Si(CH_3)(CH_3)_2$
$CH_3(CH_2)_nSi(CH_3)_2(OCH_2CH_3)$
$CH_3(CH_2)_nSi(CH_3)_2(OCH_3)$
$CH_3(CH_2)_nSi(CH_3)_2Cl$
$(CH_3)_3Si(NH) Si(CH_3)_2(CH_3)$
$(C_2H_5)_3Si(NH) Si(CH_3)_2(CH_3)$

In the formula as listed above, n is an integer of 1 or greater.

It is here noted that the above materials for the formation of the release layer are provided by way of example alone, so the invention is not limited to them. Any other materials containing in their structure a fluorine-containing group such as $CF_2$ or $CF_3$ or a functional group such as $CH_2$, $CH_3$ or $NH_2$ may be used.

Figure 3A:
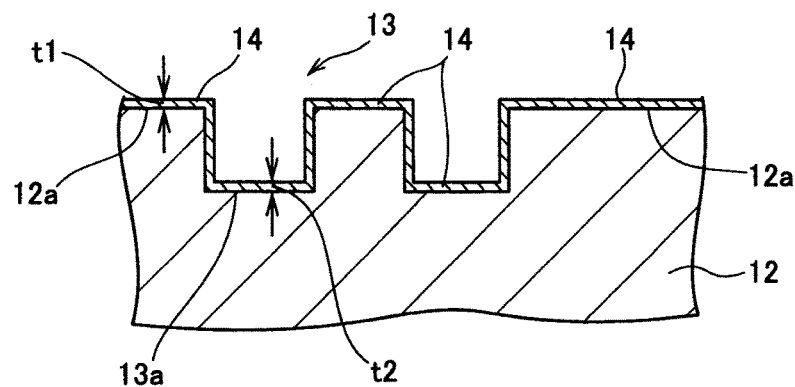
FIGS. 3A, 3B and 3C are illustrative of a form of the release layer of an imprinting mold.
Figure 3B:
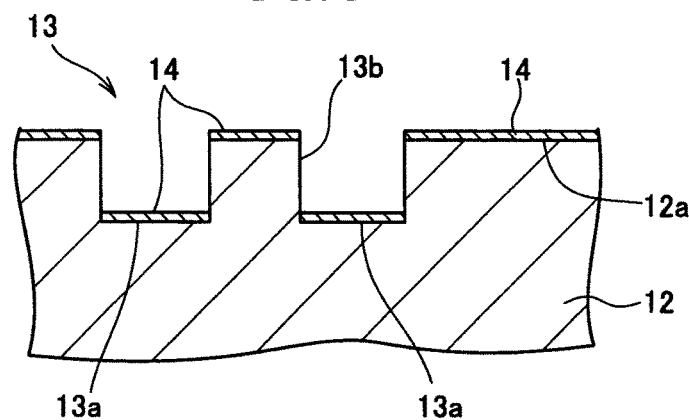
Figure 3C:
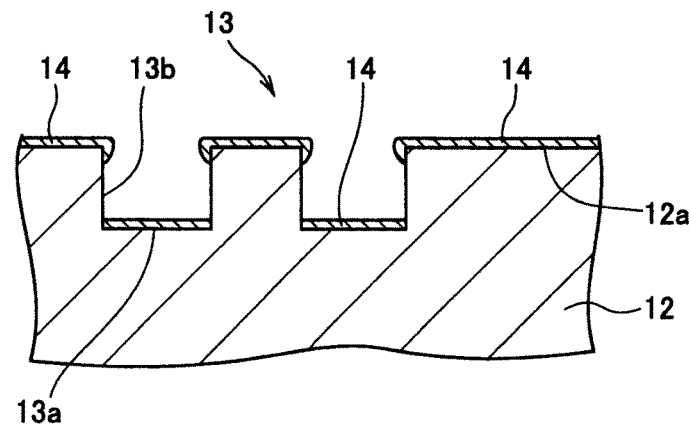

Although the release layer is shown to have uniform thickness in FIGS. 1 and 2, it may be configured as shown in FIGS. 3A, 3B and 3C. As shown typically in FIG. 3A, the thickness t1 of the release layer 14 on one surface 12$a$ of the substrate 12 may be different from the thickness t2 of the release layer 14 at the bottom 13$a$ of the uneven structure 13 (the thickness t1 is shown to be greater than t2 in FIG. 3A). The release layer 14 shown in FIG. 3B is formed on one surface 12$a$ of the substrate 12 and at the bottom 13$a$ of the uneven structure 13, with the uneven structure 13 exposed at the side wall 13$b$. The release layer 14 shown in FIG. 3C is formed on one surface 12$a$ of the substrate 12 and at the bottom 13$a$ of the uneven structure 13, and the release layer 14 on one surface 12$a$ of the substrate 12 wraps around a part of the side wall 13$b$ of the uneven structure 13.

Figure 4A:
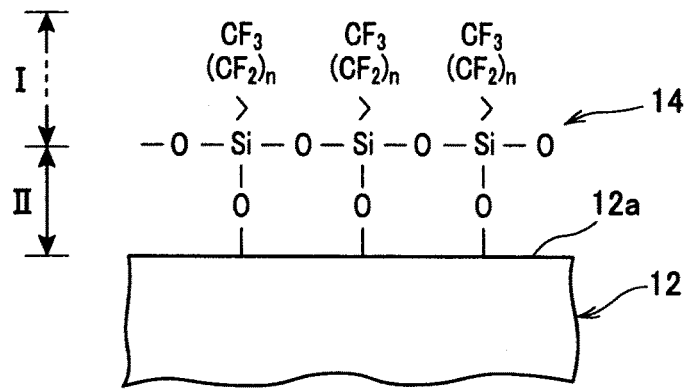
FIGS. 4A, 4B and 4C are step diagrams illustrative of the imprinting mold cleaning process according to the invention.
Figure 4B:
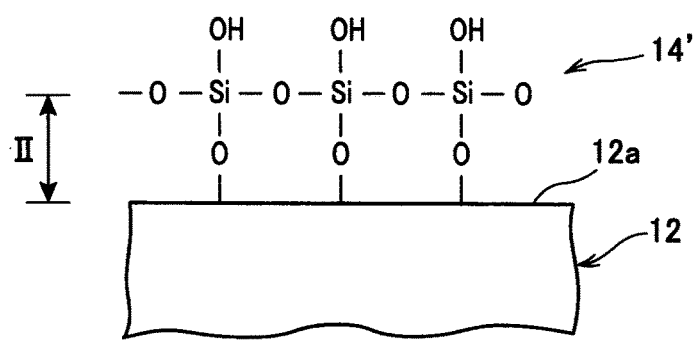
Figure 4C:
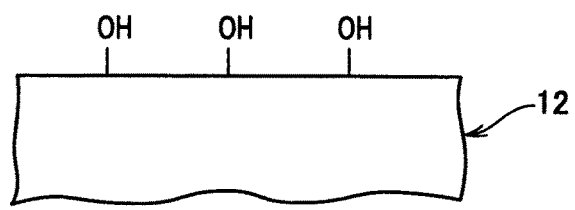

The imprinting mold cleaning process according to the invention will now be explained with reference to the accompanying drawings. FIGS. 4A, 4B and 4C are step diagrams for illustrating the imprinting mold cleaning process according to the invention, wherein the imprinting mold 11 shown in FIG. 1 is used as an example. The release layer 14 coupled via siloxane bonds to the substrate 12 of the mold comprises an organic substance area I including water repellent groups and a siloxane bond area II, the organic substance area I being coupled via the siloxane bond area II to the substrate 12 of the mold (FIG. 4A). In other words, when such a silane coupling agent as listed above is used for the formation of the release layer 14, the alkoxy or alkyl groups in the silane coupling agent used turn into silanol groups (SiOH) by hydrolysis. And there is the siloxane bond (Si—O) area II formed to the surface 12a of the substrate 12, and the organic substance area I containing water repellent groups ($CF_3$ in FIG. 4A) is positioned on the surface side of the release layer 14 (the side that opposes to the substrate 12 with the siloxane bond area II interposed between them).

In the first cleaning step of the cleaning process according to the invention, the angle of contact with water of the release layer 14 formed on the mold is made small or the water repellent groups contained in the release layer 14 are cleft. Such a first cleaning step is provided by at least one of a step of irradiating the release layer 14 with light including a wavelength range of less than 190 nm, a step of irradiating the release layer 14 with light including a wavelength range of 190 nm to 370 nm, a step of applying asking to the release layer 14, and a step of irradiating the release layer 14 with electron radiation. In other words, the first cleaning step may be implemented by a combination of two or more such steps. Through such a first cleaning step, the organic substance area I of the release layer 14 is so decomposed that the angle of contact of the surface of the release layer with water is made small or the water repellent groups are cleft and removed whereby a release layer 14' is obtained with the siloxane bond area II exposed (FIG. 4B).

In the release layer 14 to which the first cleaning step has been applied, the organic substance area I is completely decomposed and removed, as shown. Note here that the object of the first cleaning step according to the invention is to facilitate exertion of the cleaning action of the alkali cleaning agent on the release layer 14' in the following second cleaning step. Accordingly, even when there is a portion of the organic substance area I left not decomposed, the advantage of the invention would be well ensured, provided that the alkali cleaning agent enters the release layer 14' without being repelled by it, so much that it can cleave the siloxane bonds. In view of such an object of the first cleaning step, the advantages of the invention could be ensured if the angle of contact of the release layer 14' with water is not greater than 95°, preferably not greater than 75°, and more preferably not greater than 45°. Note here that the angle of contact with water may be measured using a contact angle meter (Model DM-700 made by Kyowa Interface Science Co., Ltd.) 10 seconds after water droplets dropped out of a microsyringe.

The aforesaid light including a wavelength range of less than 190 nm is understood to mean not only light that consists only of light including a wavelength range of less than 190 nm but also light whose substantial part is accounted for by light including a wavelength range of less than 190 nm in view of energy but which includes light having a wavelength range of greater than 190 nm as well. Such light including a wavelength range of less than 190 nm, for instance, includes excimer light having a peak wavelength of 126 nm, 146 nm, and 172 nm, low-pressure ultraviolet light having a peak wavelength of 185 nm, and light coming out of a light source where there is no peak wavelength in a wavelength range of less than 190 nm. Such light is capable of cleaving Si—C bonds, C—H bonds, C—C bonds and C—O bonds in the organic substance area I. The dose of light may optionally be set such that the dose of light including a wavelength range of less than 190 nm comes within the range of 1 to 10,000 $mJ/cm^2$, and the luminous intensity and irradiation time may be set as well in consideration of peak wavelengths. In this conjunction, there is the possibility that continued irradiation with short-wavelength light may give rise to a rise in the substrate temperature of the mold that would otherwise have an adverse influence on pattern size. With that possibility in mind, the dose of light including a wavelength range of less than 190 nm should more preferably be set within the range of 1 to 8,000 $mJ/cm^2$.

The aforesaid light including a wavelength range of 190 nm to 370 nm is understood to mean not only light that consists only of light including a wavelength range of 190 nm to 370 nm but also light whose substantial part is accounted for by light including a wavelength range of 190 nm to 370 nm in view of energy but which includes light having a wavelength range of greater than 370 nm as well. Such light including a wavelength range of 190 nm to 370 nm, for instance, includes 193 nm ArF laser and 248 nm KrF laser generally used for semiconductor exposure systems, far-ultraviolet light having a peak wavelength of 222 nm, and 254 nm, and ultraviolet light having a peak wavelength of 308 nm, and 365 nm. A variety of light coming from a light source where there is no peak wavelength in the wavelength range of 190 nm to 370 nm may also be used. For instance, ultraviolet light having a peak wavelength of 365 nm is capable of cleaving C—O bonds, ultraviolet light having a peak wavelength of 308 nm is capable of C—O bonds and C—C bonds, far-ultraviolet light having a peak wavelength of 254 nm is capable of cleaving C—O bonds, C—C bonds, C—H bonds and Si—C bonds, and far-ultraviolet light having a peak wavelength of 222 nm is capable of cleaving C—O bonds, C—C bonds, C—H bonds, Si—C bonds and C—F bonds. The dose of such light may optionally be set such that the dose of light including a wavelength range of 190 nm to 370 nm comes within the range of 1 to 100,000 $mJ/cm^2$, and the luminous intensity and irradiation time may be set as well in consideration of peak wavelengths. In this conjunction, there is the possibility that continued irradiation with short-wavelength light may give rise to a rise in the substrate temperature of the mold that would otherwise have an adverse influence on pattern size. With that possibility in mind, the dose of light including a wavelength range of 190 nm to 370 nm should more preferably be set within the range of 1 to 80,000 $mJ/cm^2$.

Referring here to equipment generally and widely used for substrate cleaning, there is the mention of a cleaning apparatus making use of excimer light having a peak wavelength of 172 nm or the like. Such light having a wavelength range of less than 190 nm, on the one hand, would expect to exert satisfactory cleaning action but, on the other hand, has energy high enough to cleave Si—O bonds. For this reason, when the substrate of the mold is quartz, such changes as mentioned just below are supposed to take place:

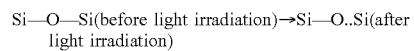
Si—O—Si(before light irradiation)→Si—O..Si(after light irradiation)

As formulated above, the Si—O bonds are cleft by irradiation with light; however, they are later recombined, resulting in a change in the Si—O bond distance before and after irradiation with light. In turn, this may possibly cause fluctuations in pattern dimensions on the mold and defects such as mold distortion. For this reason, when there is some strict limitation on pattern dimensions on the mold as will be experienced in certain semiconductor applications, cleaning using light including a wavelength range of 190 nm to 370 nm seems preferable to cleaning using light including a wavelength range of less than 190 nm.

For instance, when the aforesaid ultraviolet light having a peak wavelength of 365 nm is used, C—O bonds in the organic substance area I are cleft, but bonds (C—C bonds, C—H bonds, Si—C bonds and C—F bonds) having large bond strength are left uncut, failing to completely expose the siloxane bond area II, unlike such a release layer 2' as shown in FIG. 1(B). However, the C—O bonds in the organic substance area I are so cleft that some of the water repellent groups the organic substance area I has are removed. Accordingly, the alkali cleaning agent used in the second cleaning step to be described later enters the release layer 14' without being repelled by it, so much that the repellency of the release layer 14' is reduced (for instance, the angle of contact of the release layer 14' with water becomes 95° or smaller), making a lot more improvement in the cleaning action of the alkali cleaning agent on the siloxane bond area II. In the first cleaning step, it is thus preferable to use light on a shorter wavelength side in the range of 190 nm to 370 nm; however, if the organic substance area I in the release layer 14 is a material having at least C—O bonds, the advantages of the invention would then be still maintained by cleaving the C—O bonds.

In the aforesaid asking step, for instance, the organic substance area I is asked and removed by at least one species of active radicals and ions. Specifically, the mold to be cleaned is placed within a vacuum chamber as an example, and while oxygen, fluorine, a mixed gas of an inert gas with oxygen or fluorine, or the like is fed into the vacuum chamber, the desired high-frequency current is applied into it to generate plasma. At least one species of the resultant oxygen radicals, fluorine radicals, argon radicals, oxygen ions, fluorine ions, argon ions, and ozone is used to ash and remove the organic substance area I. The degree of vacuum in the vacuum chamber may optionally be set, for instance, within the range of 1 to 1,000 mTorr.

The water repellent groups contained in the aforesaid release layer 14 may be cleft by feeding to it energy greater than the bond energy of elements forming the water repellent groups using energy radiation such as electron radiation. Thus, the cleaning by irradiation with electron radiation could have the same advantages as the aforesaid cleaning by irradiation with light. Irradiation with electron radiation may be implemented using an electron radiation generator known so far in the art. The dose of electron radiation may optionally be set such that the repelling action of the release layer 14' is reduced so much that the alkali cleaning agent used in the second cleaning step to be described later can enter the release layer 14' without being repelled by it.

In the second cleaning step of the cleaning process according to the invention, the alkali cleaning agent is then brought in contact with the release layer 14' of the mold whose cleaning has already been finished. In this second cleaning step, the siloxane bonds in the siloxane bond area II of the release layer 14' remaining on the substrate 12 of the mold are cleft and the release layer 14' is removed: the cleaning cycle of the invention is completed (FIG. 4C). It is when the angle of contact with water of the post-cleaning substrate 12 of the mold is within the range of +2° with respect to the angle of contact with water of the substrate 12 of the mold before the release layer 14 is formed on it that the release layer 14 is judged as being removed. It is here to be noted that the substrate 12 of the mold before the release layer 14 is formed on it means a substrate in a state in which organic substances, etc. adsorbed onto the surface of the substrate before the release layer is formed on it are removed. Thus, the substrate 12 of the mold whose cleaning has been finished according to the invention is ready for the reformation of a fresh release layer using the aforesaid silane coupling agent. It is here preferable that after the completion of the second cleaning step, the mold is washed with pure water, warmed water or the like for removal of the alkali cleaning agent.

The alkali cleaning agent used in this second cleaning step, for instance, includes an ammonia/hydrogen peroxide mixed solution (APM), potassium hydroxide, sodium hydroxide, carbonates, and soda silicate. The aforesaid APM may be used in combination with a sulfuric acid/hydrogen peroxide mixed solution (SPM), and hydrogen fluoride, ozone water, surfactants or the like may be used as well. The temperature of the alkali cleaning agent used may optionally be set typically within the range of 23° C. to 200° C., and the alkali cleaning agent may be brought in contact with the release layer 2 of the mold by means of dipping, spraying, ultrasonic cleaning, and a method wherein the alkali cleaning agent is fed to the release layer 14, followed by its removal by spinning (puddle cleaning method). During the aforesaid dipping operation, the mold may be rocked in the alkali cleaning agent.

In such an imprinting mold cleaning process according to the invention, the angle of contact of the surface of the release layer with water is made small or the water repellent groups contained in the surface of the release layer are cleft in the first cleaning step. For this reason, in the following second cleaning step using the alkali cleaning agent, the repelling of the alkali cleaning agent by the release layer is reduced enough to facilitate exertion of the cleaning action of the alkali cleaning agent on the release layer, resulting in cleavage of the siloxane bonds that function as holding the release layer in close contact with the mold. Such first and second cleaning steps combined provide good cleaning action on the release layer. In addition, the time taken in the second cleaning step using the alkali cleaning agent is by far shorter than could be achieved with a cleaning process relying solely on the alkali cleaning agent, and even molds made of materials poor in alkali resistance such as quartz glass or silicon may be cleaned: there is no limitation on the molds to be cleaned by the cleaning process according to the invention.

The imprinting mold cleaning process of the invention as described above is nothing more than one example; so the invention would be in no sense limited to that embodiment.

For instance, there may be other cleaning step applied between the first and the second cleaning step. Such other cleaning step, for instance, may be a rinsing step for removal of the cleft water repellent groups.

Before the first cleaning step, there may also be a moisture removal step provided. The purpose of this moisture removal step is to prevent cleaning variations occurring as a result of absorption of light or electron radiation by oxygen atoms of residual water molecules at the time of irradiation of the release layer with light or electron radiation in the first cleaning step. The moisture removal step, for instance, may be implemented by vacuum drying, dehydration baking, drying over low-boiling solvents, a supercritical contact method, and centrifugal drying.

Further, there may be a static electricity removal step provided after the first cleaning step, and after the second cleaning step. Static electricity removal may be implemented using known static electricity removal equipment, for instance, a soft X-ray irradiation mode or corona discharge mode equipment. Such a static electricity removal step is effective to prevent water droplets falling down from a microsyringe from missing the site to be measured and turning to an undesired site at the time of measuring the angle of contact with water of the release layer 14' after treated in the first cleaning step, and the angle of contact with water of the substrate 12 after treated in the second cleaning step.

Imprinting Mold Cleaning Apparatus

The imprinting mold cleaning apparatus according to the invention will now be explained.

FIG. 5 is illustrative in construction of one example of the basic arrangement of the cleaning apparatus according to the invention that is a cleaner designed to clean an imprinting mold including a release layer coupled via siloxane bonds to a substrate of that the imprinting mold. A cleaning apparatus of the invention, generally shown at 41, comprises a first cleaning unit 42 operable to make the surface of the release layer of the imprinting mold hydrophilic, and a second cleaning unit 43 operable to apply alkali cleaning to the imprinting mold made hydrophilic in the first cleaning unit. The cleaning apparatus further comprises a measuring unit 44 for measuring the surface state of the imprinting mold and a judgment unit 47. The judgment unit 47 comprises a first judgment unit operable to judge whether or not the surface of the release layer made hydrophilic in the first cleaning unit 42 can be alkali-cleaned on the basis of the result of measurement in the measuring unit 44, and a second judgment unit operable to judge whether or not the release layer is removed from the imprinting mold alkali-cleaned in the second cleaning unit 43 on the basis of the result of measurement in the measuring unit 44.

FIG. 6 is illustrative in construction of another example of the basic arrangement of the imprinting mold cleaning apparatus according to the invention. The cleaning apparatus 41 shown in FIG. 6 differs from the cleaning apparatus 41 shown in FIG. 5 in that the judgment unit is separated to a first judgment unit 48 and a second judgment unit 49. More specifically, the first judgment unit 48 is operable to judge whether or not the surface of the release layer made hydrophilic in the first cleaning unit 42 can be alkali-cleaned on the basis of the result of measurement in the measuring unit 44, and the second judgment unit 49 is operable to judge whether or not the release layer is removed from the surface of the alkali-cleaned imprinting mold on the basis of the result of measurement in the measuring unit 44.

FIG. 7 is illustrative in construction of yet another example of the basic arrangement of the imprinting mold cleaning apparatus according to the invention. A cleaning apparatus 41 shown in FIG. 7 differs from the cleaning apparatus 41 shown in FIG. 6 in that the measuring unit is separated to a first measuring unit 45 and a second measuring unit 46. More specifically, the first judgment unit 48 is operable to judge whether or not the surface of the release layer made hydrophilic in the first cleaning unit 42 can be alkali-cleaned on the basis of the result of measurement in the first measuring unit 45, and the second judgment unit 49 is operable to judge whether or not the release layer is removed from the surface of the alkali-cleaned imprinting mold on the basis of the result of measurement in the second measuring unit 46.

The aforesaid basic arrangements of the cleaning apparatus are provided for the purpose of illustration alone; so the invention would be in no sense limited to them. For instance, the release layer may be made hydrophilic on its surface in the first cleaning unit 42 while the surface state of the imprinting mold is measured in the measuring unit 44, and in the first measuring unit 45.

The imprinting mold to be cleaned by the cleaning apparatus 41 according to the invention is the same as explained above in conjunction with the imprinting mold cleaning process; so it will not be explained any longer.

The first cleaning unit 42 forming a part of the cleaning apparatus 41 according to the invention may be built up of a light irradiator, asking equipment, an electron radiation irradiator, and so on.

The light irradiator, for instance, includes a light irradiator capable of irradiating light including a wavelength range of less than 190 nm, and a light irradiator capable of irradiating light including a wavelength of 190 nm to 370 nm. For the light irradiator capable of irradiating light including a wavelength range of less than 190 nm, for instance, there is the mention of equipment capable of irradiating excimer light having a peak wavelength of 126 nm, 146 nm, and 172 nm, and equipment capable of irradiating low-pressure ultraviolet light or the like having a peak wavelength of 185 nm. There is also the mention of equipment capable of irradiating light whose substantial portion is accounted for by light including a wavelength range of less than 190 nm in view of energy but in which there is no peak wavelength in a wavelength range of less than 190 nm, and so on.

For the light irradiator capable of irradiating light including a wavelength range of 190 nm to 370 nm, there is the mention of a 193 nm ArF laser and 248 nm KrF laser generally used in semiconductor exposure systems, equipment capable of irradiating far-ultraviolet light having a peak wavelength of 222 nm, and 254 nm, ultraviolet light having a peak wavelength of 308 nm, and 365 nm, etc. There is also the mention of equipment capable of irradiating light whose substantial portion is accounted for by light including a wavelength range of 190 nm to 370 nm in view of energy but in which there is no peak wavelength in a wavelength range of 190 nm to 370 nm, and so on.

The ashing equipment is operable to feed at least one species of active radicals and ions to the organic substance area I in the release layer of the imprinting mold (see FIG. 4A). For instance, there is the mention of equipment including a vacuum chamber for receiving the mold to be cleaned and a high-frequency current applicator. In the ashing equipment, oxygen, fluorine, or a mixed gas of an inert gas with oxygen or fluorine may be fed into the vacuum chamber, and the desired high-frequency current is applied to it to generate plasma. At least one species of the resultant oxygen radicals, fluorine radicals, argon radicals, oxygen ions, fluorine ions, argon ions, and ozone is used to ash and get rid of the organic substance area I of the release layer.

For the electron radiation irradiator, an electron radiation generator known so far in the art may be used.

It is here to be noted that as moisture remains in the mold to be cleaned, it causes cleaning variations to occur as a result of absorption of light or electron radiation by oxygen atoms in the remaining water molecules at the time of irradiation of the release layer with light or electron radiation in the first cleaning unit 42. To prevent such cleaning variations in the first cleaning unit 42, there may be a moisture removal unit provided before the first cleaning unit 42. For instance, this moisture removal unit may be built up of a vacuum dryer, a dehydration baker, a low-boiling solvent drier, equipment for implementing a supercritical contact method, and a centrifugal drier.

In the second cleaning unit 43 forming a part of the cleaning apparatus 41 according to the invention, the alkali cleaning agent is brought in contact with the release layer of the mold delivered from the first cleaning unit 42 to remove the release layer. For such second cleaning unit 43, use may be made of a dipping tank, a dipping tank with a mold rocker built in it, a spray cleaner, a dipping tank with an ultrasonic cleaner built in it, and a spin coating cleaner for puddle cleaning purposes. In addition, there may be a heater provided so as to heat the alkali cleaning agent or the SPM or surfactant used together with it to the desired temperature.

The measuring unit 44, first measuring unit 45, and second measuring unit 46 forming a part of the cleaning apparatus 41 according to the invention is to measure the surface state of the imprinting mold, viz., the surface state after the hydrophilic treatment in the first cleaning unit 42, and the surface state after alkali cleaning in the second cleaning unit 43. Such a measuring unit, for instance, may be built up of a device for measuring the angle of contact with water, a device such as an interferometer for measuring the thickness of the release layer, a surface components analyzer such as an XPS (X-ray photoelectron spectroscopic device) for measuring the content of water repellent groups in the release layer, a device for detecting transmittance and reflectivity fluctuations in association with thickness changes of the release layer, a device such as an AFM or SEM (scanning electron microscope) for reading thickness changes of the release layer from changes in the aperture width of the concave portion in the uneven structure, and a foreign matters inspector.

The first judgment unit 47, 48 forming a part of the cleaning apparatus 41 according to the invention is operable to judge whether or not the surface of the release layer made hydrophilic in the first cleaning unit 42 can be alkali-cleaned on the basis of the result of measurement in the measuring unit 44, and the first measuring unit 45. Referring typically to the measuring unit 44, and the first measuring unit 45 built up of a device operable to measure the angle of contact with water as described above, there may be a CPU or the like used that is operable to judge alkali cleaning as being to be done in the second cleaning unit 43 when the angle of contact with water of the surface of the release layer made hydrophilic in the first cleaning unit 42 is not greater than the first reference value. The first reference value here, for instance, may be set at 95°, preferably 75°, and more preferably 45°. When the result of judgment in such first judgment unit 47, 48 indicates that alkali cleaning should be done, the mold is delivered from the first cleaning unit to the second cleaning unit. When the result of judgment in the first judgment unit 47, 48 indicates that alkali cleaning should not be done, the mold is returned back to the first cleaning unit 42 where it is again made hydrophilic. In this case, the mold should preferably be returned back to the first cleaning unit 42 via the aforesaid moisture removal unit.

The second judgment unit 47, 49 forming a part of the cleaning apparatus 41 according to the invention is operable to judge whether or not the release layer is removed from the surface of the imprinting mold alkali-cleaned in the second cleaning unit 43 on the basis of the result of measurement in the measuring unit 44, and the second measuring unit 46. Referring typically to the measuring unit 44, and the second measuring unit 46 built up of the device for measuring the angle of contact with water as described above, there may be a CPU or the like used that is operable to judge the release layer as being removed when the angle of contact with water of the surface imprinting mold alkali-cleaned in the second cleaning unit 43 is not greater than the second reference value. The second reference value here, for instance, may be set as 2° plus the angle of contact with water of the substrate of the mold before the release layer is formed on it. The "substrate of the mold before the release layer is formed on it" is here understood to mean the substrate in a state in which organic substances, etc. absorbed onto the surface of the substrate before the release layer is formed on it are removed. When the result of judgment in such second judgment unit 47, 49 indicates that the release layer has been removed, the mold is delivered out of the second cleaning unit, and when the result of judgment in such second judgment unit 47, 49 indicates that the release layer is not yet removed, the mold is returned back to the second cleaning unit 43 where it is again alkali-cleaned.

FIG. 8 is illustrative in construction of one embodiment of the imprinting mold cleaning apparatus according to the invention, which is corresponding to the basic arrangement shown in FIG. 7. In the cleaning apparatus 41 shown in FIG. 8, the first cleaning unit 42, first measuring unit 45, second cleaning unit 43 and second measuring unit 46 are lined up in series.

The first cleaning unit 42 includes a chamber 42A for receiving the mold 11 delivered by a delivery tool such as a delivery arm (not shown) and an irradiation light source 42B. The irradiation light source 42B may be either of the scan mode capable of irradiating light all over the surface of the mold 11 or of the mode capable of concurrently irradiating light all over the surface of the mold.

The first measuring unit 45 includes a dropping device 45A operable to drop water droplets onto the release layer of the mold 11 delivered out of the first cleaning unit 42 by a delivery tool such as a delivery arm (not shown), and a measuring light source 45B and detector (e.g., CCD) 45C operable to measure the angle of contact of water droplets on the release layer. This first measuring unit 45 is connected with the first judgment unit 48 (not shown).

The second cleaning unit 43 includes a turntable 43A operable to receive and hold the mold 11 delivered out of the first measuring unit 45 by a delivery tool such as a delivery arm (not shown), and a feeder 43B operable to feed the alkali cleaning agent to the mold 11 on the fast rotating turntable 43A. The feeder 43B may scan over the fast rotating turntable 43A, or may be fixed in place.

There is an exhaust hood 43C disposed over the turntable 43A, and there is a waste liquid recovery path 43D provided laterally of the feeder 43B so as to recover the alkali cleaning agent that is removed by spinning.

The second measuring unit 46 includes a dropping device 46A operable to drop water droplets onto the mold 11 delivered out of the second cleaning unit 43 by a delivery tool such as a delivery arm (not shown), and a measuring light source 46B and detector (e.g., CCD) 46C operable to measure the angle of contact of water droplets. This second measuring unit 46 is connected with the second judgment unit 49 (not shown).

The cleaning apparatus 41 further includes a moisture removal unit (not shown) provided upstream of the first cleaning unit 42.

FIG. 9 is a flowchart for cleaning treatments carried out by the imprinting mold cleaning apparatus according to the invention, and how the cleaning apparatus of FIG. 8 operates is explained with reference to this figure. First of all, the mold to be cleaned is delivered into the moisture removal unit (S1) to remove moistures deposited onto the release layer (S2).

Then, the mold 11 is delivered to the first cleaning unit 42 (S3), and irradiated in the chamber 42A with light coming from the irradiation light source 42B for hydrophilic treatment (S4). In this first cleaning unit 42, the chamber 42A is evacuated inside as the mold is irradiated with light from the irradiation light source 42B or after that light irradiation.

Then, the mold 11 is delivered to the first measuring unit 45 (S5) where the angle of contact of the release layer with water is measured (S6). This first measuring unit 45 is connected with the first judgment unit 48 (although not shown) to judge whether or not the angle of contact with water of the surface of the release layer on the mold in the first measuring unit 45 is at or less than the first reference value (S7). In the first judgment unit 48, when the angle of contact with water of the surface of the release layer is greater than the first reference value: alkali cleaning is judged as being not to be done in the second cleaning unit 43, the mold 11 is returned back to the moisture removal unit. In the first judgment unit 48, on the other hand, when the angle of contact with water of the surface of the release layer is not greater than the first reference value: alkali cleaning is judged as being to be done in the second cleaning unit 43, the mold 11 is delivered to the second cleaning unit 43 (S8).

In the second cleaning unit 43, the turntable 43A rotates at high speed with the mold 11 placed on it, and alkali cleaning is applied to the mold 11 on the turntable 43A while it is fed from the feeder 43B to it and removed by spinning (puddle cleaning)(S9).

Then, the mold 11 is delivered to the second measuring unit 46 (S10) to measure the angle of contact of the surface of the mold with water (S11). This second measuring unit 46 is connected with the second judgment unit 49 (although not shown) to judge whether or not the angle of contact of the surface of the mold with water in the second measuring unit 46 is at or less than the second reference value (S12). In the second judgment unit 49, when the angle of contact of the surface of the mold with water is greater than the second reference value: the release layer is judged as being not yet removed, the mold 11 is returned back to the second cleaning unit 43. In the second judgment unit 49, on the other hand, when the angle of contact of the surface of the mold with water is not greater than the second reference value: the release layer is judged as being removed by alkali cleaning in the second cleaning unit 43, the mold is delivered out of the second cleaning unit (S13).

The imprinting mold cleaning apparatus according to the invention as described above is provided as an example; so the invention would be in no sense limited to that embodiment.

For instance, there may be a static electricity removal unit disposed after the first cleaning unit, and after the second cleaning unit. For the static electricity removal unit here, an ionizer or other known static electricity removal unit may be used. The provision of such a static electricity removal unit helps prevent water droplets from a dropping device from missing the site to be measured and turning to an undesired site, and makes sure precise measurements when an AFM or SEM is used with the measuring unit.

There may be other cleaning unit located between the first cleaning unit and the second cleaning unit. For such other cleaning unit, for instance, there is the mention of a rinsing unit for removal of water repellent groups cleft in the first cleaning unit, or the like.

Imprinting Mold Manufacturing Process

One embodiment of the process for manufacturing imprinting molds will now be explained.

The invention provides a process for manufacturing an imprinting mold comprising a substrate, an uneven structure positioned on one surface of said substrate, and a release layer coupled via siloxane bonds to said substrate in such a way as to cover at least said uneven structure, which process includes a first cleaning step of making hydrophilic the surface of the release layer on the mold, said release layer subjected to repetitive use and decreasing in releasability, and a second cleaning step of bringing an alkali cleaning agent in contact with the release layer that have gone through the first cleaning step to expose the substrate covered with the release layer.

The imprinting mold to which the manufacturing process of the invention may be applied, for instance, may be the mold 11, 21 explained with reference to FIGS. 1, 2 and 3. Materials for the substrate 12, 22 of the mold 11, 21 may be semiconductor materials such as silicon, glasses such as quartz glass, silicate-based glass, calcium fluoride, magnesium fluoride and acrylic glass, metals such as nickel, aluminum, titanium, copper, chromium, iron, cobalt and tungsten, alloys of these metals and nonmetals such as carbon and silicon, laminates comprising any of these materials, or carbonaceous materials such as glassy carbons.

The release layer 14, 24 forming a part of the mold 11, 21 may be the one that has a structure in which an organic substance area having water repellent groups is coupled via siloxane bonds to the mold, for instance, a release layer formed using a silane coupling agent. The silane coupling agent used here, for instance, includes a fluoroalkyl-based one, and an alkyl-based one. More specifically, use may be made of the fluoroalkyl- and alkyl-based silane coupling agents mentioned in connection of the inventive cleaning process as already described.

Figure 10A:
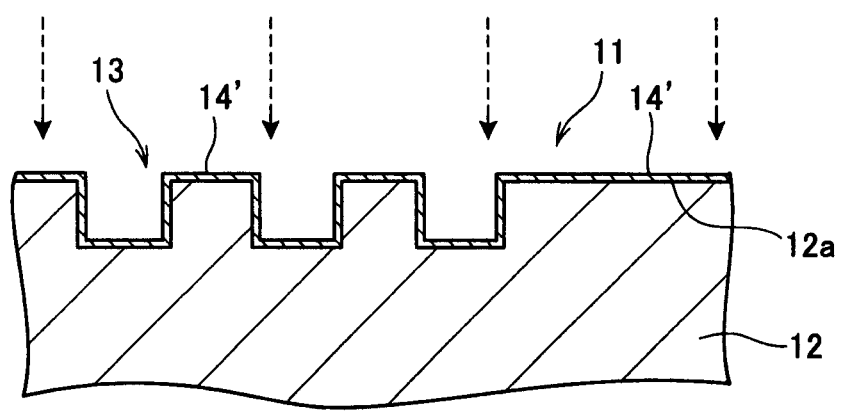
FIGS. 10A and 10B are step diagrams illustrative of one example of the process for manufacturing imprinting molds according to the invention.
Figure 10B:
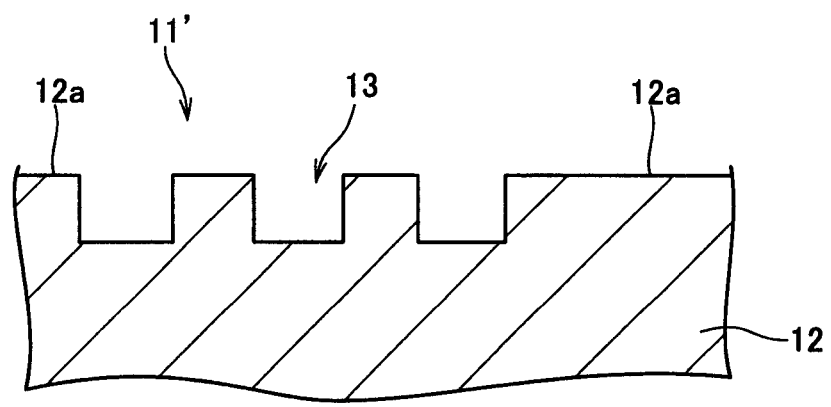

FIGS. 10A and 10B are step diagrams illustrative of the imprinting mold manufacturing process according to the invention, wherein the imprinting mold 11 shown in FIG. 1 is used as an example.

In the invention, the surface of the release layer 14 on the mold 11 is first made hydrophilic in the first cleaning step to obtain a release layer 14' (FIG. 10A). This first cleaning step is provided by at least one of a step of irradiating the release layer 14 with light including a wavelength range of less than 190 nm, a step of irradiating the release layer 14 with light including a wavelength range of 190 nm to 370 nm, a step of applying asking to the release layer 14, and a step of irradiating the release layer 14 with electron radiation. In other words, the first cleaning step may be implemented by a combination of two or more such steps. Through such first cleaning step, the organic substance area I of the release layer 14 is so decomposed that the angle of contact of the surface of the release layer with water is made small or the water repellent groups are cleft and removed whereby the release layer 14' is obtained with the siloxane bond area II exposed (see FIG. 4B). The first cleaning step will not be explained any longer, because of overlapping the first cleaning step in the inventive cleaning process as described above.

In the second cleaning step, the alkali cleaning agent is then brought in contact with the release layer that has gone through the first cleaning step to expose one surface 12a of the substrate covered with the release layer 14, thereby fabricating an imprinting mold 11' (FIG. 10B). The second cleaning step is not explained any longer, because of overlapping the second cleaning step in the inventive cleaning process as described above.

With the process for manufacturing imprinting molds according to the invention, it is possible to manufacture a mold with the substrate exposed, because the surface of the release layer is made hydrophilic in the first cleaning step, and the siloxane bonds are cleft by the alkali cleaning agent for removal of the release layer in the next second cleaning step. Accordingly, the resultant mold may be used with the substrate left exposed or, alternatively, with the desired processing applied to the surface of the substrate, depending on what purpose it is used for, the material of the workpiece, etc. In other words, it is possible to manufacture a mold usable under diverse conditions in a wide range of applications. In addition, it is possible to achieve some considerable reductions in the manufacturing cost of molds and the cost taken for imprint using molds as well.

Another embodiment of the imprinting mold manufacturing process according to the invention is then explained.

The invention provides a process for manufacturing an imprinting mold comprising a substrate, an uneven structure positioned on one surface of said substrate, and a release layer coupled via siloxane bonds to said substrate in such a way as to cover at least said uneven structure, in which the release layer is first removed from the mold subjected to repetitive use and decreasing in releasability, and a fresh release layer is then reformed to regenerate the mold again as an imprinting mold.

The imprinting mold to which the inventive manufacturing process may be applied is the same as that to which the aforesaid inventive manufacturing process may be applied.

Figure 11A:
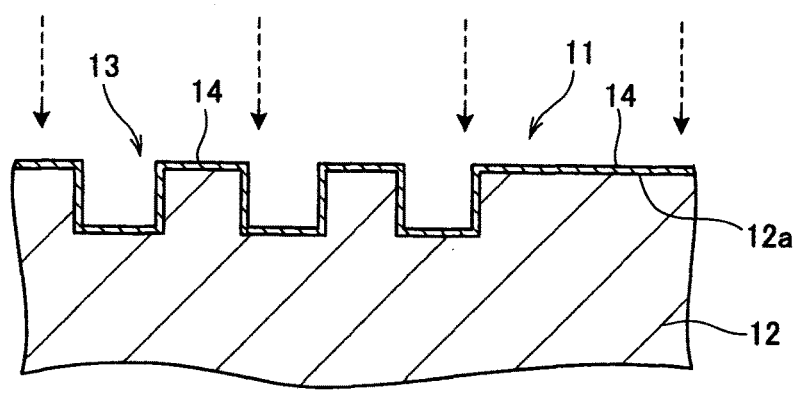
FIGS. 11A, 11B and 11C are step diagrams illustrative of another example of the process for manufacturing imprinting molds according to the invention.
Figure 11B:
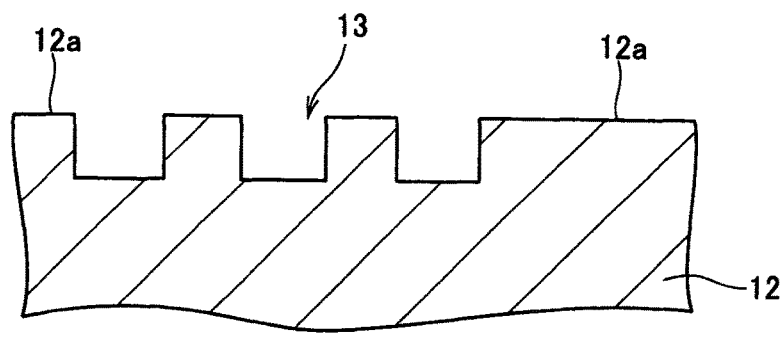
Figure 11C:
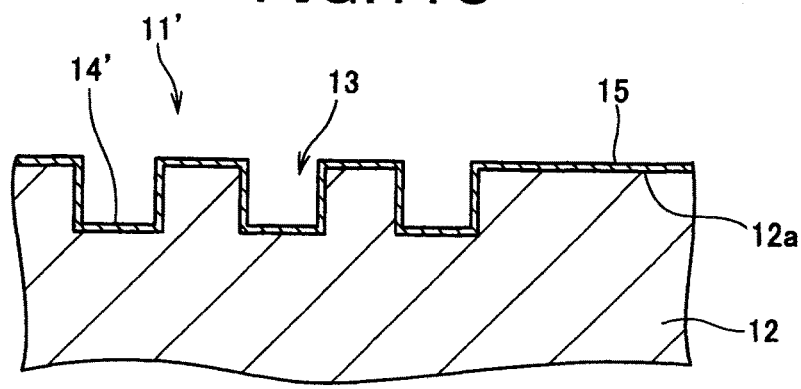

FIGS. 11A, 11B and 11C are step diagrams illustrative of the process for manufacturing imprinting molds according to the invention, wherein the imprinting mold 11 shown in FIG. 1 is used as an example.

In the cleaning step of the invention, cleaning is first applied to the mold 11 having the release layer 14 subjected to repetitive use and decreasing in releasability thereby removing the release layer 14 (FIG. 11A). As a result of removal of the release layer 14 from the mold 11, the uneven structure 13 is exposed, making sure the mold 11 gets ready for the reformation of a fresh release layer using a silane coupling agent (FIG. 11B). In this cleaning step, the release layer 14 is cleaned and removed by the inventive cleaning process as described above; that is, the angle of contact with water of the surface of the release layer 14 formed on the mold 11 is made small or water repellent groups contained in the release layer 14 are cleft in the first cleaning step. In the second cleaning step, the alkali cleaning agent is then brought in contact with the release layer 14 that has gone through the first cleaning step, thereby removing the release layer 14 from the mold 11. Such first and second cleaning steps will not be explained any longer because of overlapping those in the inventive cleaning process as described above.

In the reformation step, a fresh release layer 15 is then formed in such a way as to cover the uneven structure 13 positioned on one surface 12a of the substrate 12 of the mold 11 thereby to regenerate the mold 11 that includes the fresh release layer 15 coupled via siloxane bonds to the substrate (FIG. 11C). Such release layer 15, for instance, may be formed by coating a silane coupling agent to one surface 12a of the substrate 12 of the mold 11 by means of spin coating or the like, and drying the coating. The release layer 15 may also be formed by feeding the silane coupling agent to one surface 12a and forming a film by means of dipping, spinning or the like. In the thus formed release layer 15, silanol groups (SiOH) are formed by hydrolysis of hydrolysable groups such as alkoxy and silazane groups in the coated silane coupling agent. And siloxane bonds (Si—O) are formed between those silanol groups (SiOH) and one surface 12a of the substrate 11 to create a siloxane bond area that has a function of coupling a water repellent group-containing organic substance area to one surface 12a of the substrate 11. Thus, the formed release layer 15 has a structure in which the water repellent group-containing organic substance area is positioned on the surface side and the siloxane bond area is positioned on one surface 12a side of the substrate 11, making sure good releasability combined with good adhesion to the substrate 11. Further, the release layer 15 may be formed making use of a photo-excitation reaction in which ArF excimer laser light is collected and irradiated on the silane coupling agent through a lens in an oxygen atmosphere as an example to cause photodissociation of reactive groups such as alkyl groups, and ground-state oxygen atoms (3p) created by the resulting photoexcitation of oxygen are coupled to the dangling bonds of silicon. Note here that how to form the siloxane bonds is not limited to the foregoing. Such release layer 15 may have a thickness of, for instance, 0.3 to 100 nm, and preferably about 0.3 to 50 nm, and even when the nanometer-scale uneven structure 13 has a width of its concave or convex portion on the order of a few tens of nanometers and a depth of its concave portion or a height of its convex portion on the order of a few tens of nanometers, the mold 11 could be reproduced with high pattern reproducibility.

It is to be noted that the silane coupling agent used for the formation of the release layer 15 may be the same as, or different from, that used for the formation of the release layer 14.

With the process for manufacturing imprinting molds according to the invention, the mold is cleaned of the release layer with reliability, after which a fresh release layer is reformed to prepare a mold, making sure leaving the reformed release layer free of defects, etc. In other words, it is possible to regenerate a mold in which the release layer decreases in releasability because of repetitive use, thereby manufacturing a mold including a release layer having good releasability. The process for manufacturing imprinting molds according to the invention also ensures that the cycles of repetitive use of molds can be much more increased; for instance, if the mold is a master one, it is then possible to achieve some considerable reductions in the manufacturing cost of copy molds, and if the mold is a copy one, it is then possible to achieve some considerable reductions in the cost taken for imprint using molds.

The process for manufacturing imprinting molds according to the invention as described above is provided as an example alone; so the invention would be in no sense limited to that embodiment.

The cleaning process according to the invention may be used not only for cleaning of molds including a release layer but also for cleaning of substrates having a silane coupling agent film formed on them. For instance, the inventive cleaning process may be used for cleaning of a substrate comprising a substrate and a uv-cured resin layer in close contact with it, for instance, a layer coupled via siloxane bonds used for other purposes than releasing.

The invention will be explained in further details with reference to more specific examples.

PREPARATION OF THE MOLD TO BE CLEANED

A mold was prepared using a thin plate form of quartz glass having a thickness of 6.35 mm and a square contour shape of 25 mm×25 mm. This mold (blank) had an uneven structure having a depth of 100 nm and a line/space of 50 nm/50 nm on its one surface. The angle of contact with water of the surface of the mold (blank) having an uneven structure was found by measurement to be 2°. Note here that the angle of contact with water was measured using a contact angle meter (Model DM-700 made by Kyowa Interface Science Co., Ltd.) 10 seconds after water droplets dropped out of a microsyringe.

Then, the following two fluoroalkyl-based silane coupling agents A1 and A2 were each fed by a film deposition process to the surface of the mold (blank) having an uneven structure to form a film form of release layer (of about 2 nm in thickness), thereby preparing two molds A1 and A2. As a result of measuring the angles of contact with water of the release layers on these molds A1 and A2 by the same method as mentioned just above, the angle of contact was 109° for mold A1, and 107° for mold A2.

Silane coupling agent A1: Optool DSX made by Daikin Industries, Ltd.
$(C_4F_9(OC_3F_6)_nC_3F_6Si(OCH_3)_3)$ Silane coupling agent A2: T1770 made by Tokyo Chemical Industry Co., Ltd.
$(CF_3(CF_2)_5(CH_2)_2Si(OCH_2CH_3)_3)$ In another run, the following two alkyl-based silane coupling agents B1 and B2 were each fed by a film deposition process to the surface of the mold (blank) having an uneven structure to form a film form of release layer (of about 2 nm in thickness), thereby preparing two molds B1 and B2. As a result of measuring the angles of contact with water of the release layers on these molds B1 and B1 by the same method as mentioned above, the angle of contact was 106° for mold B1, and 101° for mold B2.

Silane coupling agent B1: O0256 made by Tokyo Chemical Industry Co., Ltd.
$(CH_3(CH_2)_{17}Si(OCH_3)_3)$ Silane coupling agent B2: O0171 made by Tokyo Chemical Industry Co., Ltd.
$(CH_3(CH_2)_7Si(OCH_2CH_3)_3)$ Then, the aforesaid molds A1, A2, B1 and B2 were repeatedly used 10 times for pattern formation by photoimprinting to make molds A1, A2, B1 and B2 to be cleaned. Note here that the aforesaid photoimprinting was implemented as follows. First of all, a photocurable resin material (PAK-01 made by Toyo Synthesis Industry Co., Ltd.) was spin-coated on a substrate of quartz glass. Then, the uneven structure side of the mold was pressed against this photocurable resin material. In this state, the photocurable resin material was then irradiated with ultraviolet radiation from the mold side to cure that resin, followed by releasing of the mold.

Example 1

The aforesaid four molds A1, A2, B1 and B2 to be cleaned were washed with water, and then baked at 120° C. for 5 minutes for moisture removal.

Then, four such molds A1, A2, B1 and B2 were cleaned as follows. In the first cleaning step, the release layer was irradiated with excimer light having a peak wavelength of 172 nm in a dose of 400 mJ/cm². In the second cleaning step, the alkali cleaning agent having the following composition was then coated on the release layer by the puddle method, and let stand alone for 2 minutes. Finally, the alkali cleaning agent was removed by spinning from the mold, which was washed with water and dried.

| Composition of the Alkali Cleaning Agent | |
|---|---|
| Water | 60% by volume |
| Aqueous Ammonia (30%) | 15% by volume |
| Aqueous Hydrogen Peroxide (30%) | 20% by volume |
| Surfactant | 5% by volume |

Example 2

As in Example 1, cleaning was applied to the molds to be cleaned except that in the first cleaning step, the release layer was irradiated with ultraviolet light having a peak wavelength of 222 nm in a dose of 60,000 mJ/cm².

Example 3

As in Example 1, cleaning was applied to the molds to be cleaned except that in the first cleaning step, the release layer was irradiated with ultraviolet light having a peak wavelength of 308 nm in a dose of 70,000 mJ/cm².

Example 4

As in Example 1, cleaning was applied to the molds to be cleaned except that in the first cleaning step, the mold to be cleaned was placed in a vacuum chamber that was reduced down to 10 mTorr inside, and high-frequency current of 100 W was applied to it while oxygen was fed to it in a flow rate of 80 sccm to apply ashing by oxygen radicals to the release layer for 1 minute.

Example 5

As in Example 1, cleaning was applied to the molds to be cleaned except that in the first cleaning step, the mold to be cleaned was placed in a vacuum chamber that was reduced down to 10 mTorr inside, and high-frequency current of 128 W was applied to it while argon and oxygen were fed to it in the respective flow rates of 20 sccm and 80 sccm to apply ashing by oxygen radicals to the release layer for 1 minute.

Example 6

As in Example 1, cleaning was applied to the molds to be cleaned except that in the first cleaning step, the release layer was irradiated with ultraviolet light having a peak wavelength of 365 nm in a dose of 90,000 mJ/cm².

Example 7

As in Example 1, cleaning was applied to the molds to be cleaned except that in the first cleaning step, the release layer was irradiated first with ultraviolet light having a peak wavelength of 365 nm in a dose of 40,000 mJ/cm², and then with ultraviolet light having a peak wavelength of 308 nm in a dose of 50,000 mJ/cm².

Comparative Example 1

In only the second cleaning step as in Example 1, that is, without recourse to the first cleaning step, cleaning was applied to the molds to be cleaned.

Comparative Example 2

Four such molds A1, A2, B1 and B2 to be cleaned were each dipped in an aqueous potassium hydroxide solution having a concentration of 48% used as the alkali cleaning agent for 2 minutes, and then washed with water and dried.

Comparative Example 3

Four such molds A1, A2, B1 and B2 to be cleaned were each placed in a vacuum chamber that was reduced down to 10 mTorr inside, and high-frequency current of 130 W was applied to it while oxygen was fed to it in a flow rate of 80 sccm to apply ashing by oxygen radicals to the release layer for 1 minute, followed by washing with water and drying.

Comparative Example 4

Four such molds A1, A2, B1 and B2 to be cleaned were each placed in a vacuum chamber that was reduced down to 10 mTorr inside, and high-frequency current of 130 W was applied to it while $CF_4$ was fed to it in a flow rate of 80 sccm to apply ashing by fluorine radicals to the release layer for 1 minute, followed by washing with water and drying.
Estimation of Cleaning The four molds A1, A2, B1 and B2 cleaned in Examples 1 to 7 and Comparative Examples 1 to 4 were each measured for the angle of contact $\theta_1$ with water of the surface having an uneven structure as described above. The results are tabulated in Table 1 given just below. In the invention, good cleaning is judged as could be done if the angle of contact $\theta_1$ with water of the surface having an uneven structure after cleaning falls within the range of +2° with respect to the angle of contact of 2° with water of the surface of the mold (blank) having an uneven structure.

TABLE 1

| Cleaning Process | Molds to be Cleaned | | | |
|---|---|---|---|---|
| | A1 $\theta_0 = 109°$ $\theta_1$ | A2 $\theta_0 = 107°$ $\theta_1$ | B1 $\theta_0 = 106°$ $\theta_1$ | B2 $\theta_0 = 101°$ $\theta_1$ |
| Ex. 1 | 3 | 2 | 2 | 2 |
| Ex. 2 | 2 | 2 | 2 | 2 |
| Ex. 3 | 2 | 2 | 2 | 2 |
| Ex. 4 | 2 | 3 | 2 | 2 |
| Ex. 5 | 3 | 2 | 2 | 2 |
| Ex. 6 | 4 | 97 | 99 | 95 |
| Ex. 7 | 3 | 3 | 2 | 2 |
| Comp. Ex. 1 | 100 | 101 | 99 | 94 |
| Comp. Ex. 2 | 102 | 100 | 101 | 90 |
| Comp. Ex. 3 | 43 | 47 | 47 | 51 |
| Comp. Ex. 4 | 45 | 43 | 42 | 38 |

As set out in Table 1, it has been confirmed that the release layers can be cleaned and removed by the inventive cleaning process (Examples 1 to 5) from all the four molds A1, A2, B1 and B2 to be cleaned. From comparisons of the doses necessary for cleaning in Examples 2 and 3, it has also been ascertained that cleaning efficiency grows high by irradiation with light on a shorter wavelength side in the peak wavelength range of 190 nm to 370 nm.

Further, it has been confirmed that the inventive cleaning process of Example 6 enables the release layer to be cleaned and removed from the mold A1 to be cleaned. In the mold A2, B1, and B2 to be cleaned wherein the silane coupling agent forming the release layer is the silane coupling agent A2, B1, and B2 including a bond having high bond strength (C—C bond, C—H bond, Si—C bond, and C—F bond), by contrast, the alkali cleaning agent could not exert sufficient cleaning action because of being repelled by the release layer, so there was insufficient cleaning and removal of the release layer. From this, the inventive cleaning process of Example 6 using ultraviolet light having a peak wavelength of 365 nm could be applied depending on the silane coupling agent forming the release layer.

On the other hand, it has been confirmed that the inventive cleaning process of Example 7 can be applied to all of the four molds A1, A2, B1 and B2 for cleaning and removal of the release layers. From a study of this Example 7 and Example 6, it is found that if irradiation with ultraviolet light having a peak wavelength of 365 nm is combined with irradiation with ultraviolet light having a peak wavelength of 308 nm, any limitation on the mold to be cleaned can be lifted off, and light on a longer wavelength side in the peak wavelength range of 190 nm to 370 nm can be used, resulting in more facile inhibition of rises in the substrate temperature of the mold.

In Comparative Examples 1 and 2 without recourse to the first cleaning step of the inventive process, however, the alkali cleaning agent could not exert sufficient cleaning action because of being repelled by the release layer, resulting in unsatisfactory cleaning and removal of the release layer.

The cleaning process of Comparative Example 3, and 4 resulted in unsatisfactory cleaning and removal of the release layer too.
Preparation of the Imprinting Mold The surfaces, each having an uneven structure, of the fourth molds A1, A2, B1 and B2 cleaned by the cleaning processes of Examples 1 to 7 and Comparative Examples 1 to 4 were used with the associated silane coupling agents A1, A2, B1 and B2 to reform release layers under the same conditions as those for forming the release layer on the aforesaid mold (blank), thereby preparing molds. The thus prepared molds were each measured for the angle of contact $\theta_2$ of the release layer with water. The results are tabulated in Table 2 given just below.

TABLE 2

| Cleaning Process | Molds to be Cleaned | | | |
|---|---|---|---|---|
| | A1 $\theta_2$ | A2 $\theta_2$ | B1 $\theta_2$ | B2 $\theta_2$ |
| Ex. 1 | 109 | 108 | 105 | 101 |
| Ex. 2 | 108 | 108 | 106 | 100 |
| Ex. 3 | 108 | 107 | 105 | 100 |
| Ex. 4 | 109 | 106 | 106 | 101 |
| Ex. 5 | 109 | 107 | 105 | 101 |
| Ex. 6 | 108 | 100 | 101 | 96 |
| Ex. 7 | 108 | 106 | 105 | 100 |
| Comp. Ex. 1 | 100 | 100 | 101 | 96 |
| Comp. Ex. 2 | 102 | 98 | 97 | 95 |
| Comp. Ex. 3 | 63 | 50 | 52 | 57 |
| Comp. Ex. 4 | 70 | 49 | 43 | 47 |

As set out in Table 2, it has been confirmed that in all four molds A1, A2, B1 and B2 to be cleaned: the regenerated molds, each having a fresh release layer reformed after the release layer had been cleaned and removed by the inventive cleaning process (Examples 1 to 5), the reformed fresh release layer can exert good water repellency comparable to that of the corresponding release layer formed first on the mold (blank).

It has also been ascertained that in the mold A1 to be cleaned: the regenerated mold having a fresh release layer reformed after the release layer had been cleaned and removed by the inventive cleaning process of Example 6, the reformed fresh release can exert good water repellency comparable to that of the corresponding release layer formed first on the mold (blank). In the molds A2, B1 and B2 to be cleaned, wherein the silane coupling agents A2, B1 and B2, each having a bond of higher bond strength (C—C bond, C—H bond, Si—C bond, and C—F bond), was used as the silane coupling agent forming the release layer, by contrast, there was insufficient cleaning and removal of the release layer, giving rise to defects in the reformed layer, and rendering the water repellency of the release layer inadequate. From this, the inventive cleaning process of Example 6 could be applied depending on the silane coupling agent forming the release layer.

It has also been confirmed that in all four molds A1, A2, B1 and B2 to be cleaned: the regenerated molds, each having a fresh release layer reformed after the release layer had been cleaned and removed by the inventive cleaning process of Example 7, the reformed fresh release layer can exert good water repellency comparable to that of the corresponding release layer formed first on the mold (blank). From a study of this Example 7 and Example 6, it is found that if irradiation with ultraviolet light having a peak wavelength of 365 nm is combined with irradiation with ultraviolet light having a peak wavelength of 308 nm, it is possible to reform a fresh release layer that can exert good water repellency, and light on a longer wavelength side in the peak wavelength range of 190 nm to 370 nm can be used, resulting in more facile inhibition of rises in the substrate temperature of the mold.

In the comparative regenerated molds, each having a fresh release layer reformed after the release layer had been cleaned and removed by the cleaning processes of Comparative Examples 1, 2, 3 and 4, however, there were imperfections remaining in the reformed release layer, and the water repellency of the release layer was insufficient as well.

APPLICABILITY TO THE INDUSTRY

The present invention could found use in various processing fields using imprint technologies.

EXPLANATIONS OF THE REFERENCE NUMERALS 11, 21: Imprinting Mold
12, 22: Substrate
13, 23: Uneven Structure
14, 14', 15, 24: Release Layer
41: Cleaning Apparatus
42: First Cleaning Unit
43: Second Cleaning Unit
44: Measuring Unit
45: First Measuring Unit
46: Second Measuring Unit
47: Judgment Unit
48: First Judgment Unit
49: Second Judgment Unit

What is claimed is:

1. A process for cleaning an imprinting mold including a release layer coupled via siloxane bonds to a substrate of the imprinting mold, comprising:
    performing a first cleaning step that includes treating the release layer so as to reduce an angle of contact with water of a surface of the release layer,
    measuring the angle of contact with water of the surface of the release layer with a measuring unit,
    judging with a judgment unit whether or not the angle of contact with water of the surface of the release layer measured by the measuring unit is not greater than a first reference value so as to judge whether or not the surface of the release layer has been sufficiently treated to proceed to a second cleaning step,
    wherein the first cleaning step is repeated if the judging indicates that the surface of the release layer has not been sufficiently treated to proceed to the second cleaning step, and wherein if the judging indicates that the surface of the release layer has been sufficiently treated to proceed to the second cleaning step, then
    performing the second cleaning step that includes bringing an alkali cleaning agent in contact with the release layer that has been subjected to the first cleaning step,
    measuring an angle of contact with water of a surface of the imprinting mold with the same or different measuring unit, and
    judging with the same or different judgment unit whether or not the angle of contact with water of the surface of the imprinting mold measured by the same or different measuring unit is not greater than a second reference value that is set less than the first reference value so as to judge whether or not the release layer has been removed,
    wherein the second cleaning step is repeated if the judging indicates that the release layer has not been removed.

2. The process according to claim 1, wherein the first cleaning step is performed such that the angle of contact with water of the surface of the release layer is reduced so as to be not greater than 95°.

3. The process according to claim 1, wherein the first cleaning step includes at least one step selected from the group consisting of a step of irradiating the release layer with light including a wavelength range of less than 190 nm, a step of irradiating the release layer with light including a wavelength range of 190 nm to 370 nm, a step of applying ashing to the release layer, and a step of irradiating the release layer with electron radiation.

4. The process according to claim 3, wherein irradiation of the release layer with light including a wavelength range of less than 190 nm in the first cleaning step is implemented such that a dose of light including a wavelength range of less than 190 nm is within a range of 1 to 10,000 mJ/cm$^2$.

5. The process according to claim 3, wherein irradiation of the release layer with light including a wavelength range of 190 nm to 370 nm in the first cleaning step is implemented such that a dose of light including a wavelength range of 190 nm to 370 nm is in a range of 1 to 100,000 mJ/cm$^2$.

6. The process according to claim 3, wherein the ashing applied to the release layer in the first cleaning step is implemented with at least one species selected from the group consisting of active radicals and ions.

7. The process according to claim 6, wherein the ashing applied to the release layer in the first cleaning step is implemented with at least one species selected from the group consisting of oxygen radicals, fluorine radicals, argon radicals, oxygen ions, fluorine ions, argon ions, and ozone.

8. The process according to claim 1, including a moisture removal step prior to the first cleaning step.

9. The process according to claim 1, wherein the first cleaning step includes at least one step selected from the group consisting of a step of irradiating the release layer with electron radiation, and a step of applying ashing by application of at least one species of active radicals and ions from plasma.

10. The process according to claim 9, wherein the at least one species of active radicals and ions from plasma is selected from the group consisting of oxygen radicals, fluorine radicals, argon radicals, oxygen ions, fluorine ions, argon ions, and ozone, generated from oxygen, fluorine, or a mixed gas of an inert gas with oxygen or fluorine.

11. The process according to claim 1, wherein measuring is performed by the same measuring unit.

12. The process according to claim 11, wherein judging is performed by the same judgment unit.

13. The process according to claim 1, wherein measuring is performed by different measuring units, and judging is performed by different judgment units.

14. The process according to claim 1, wherein the first reference value is an angle of contact with water of the surface of the release layer of not greater than 95° and the second reference value is an angle of contact with water of the surface of the imprinting mold that is 2° larger than an angle of contact with water of the surface of the imprinting mold before formation of the release layer.

15. A process for cleaning an imprinting mold including a release layer coupled via siloxane bonds to a substrate of the imprinting mold, comprising:
  performing a first cleaning step that includes treating the release layer so as to cleave water repellent groups contained in a surface of the release layer,
  measuring an angle of contact with water of the surface of the release layer with a measuring unit,
  judging with a judgment unit whether or not the angle of contact with water of the surface of the release layer measured by the measuring unit is not greater than a first reference value so as to judge whether or not the surface of the release layer has been sufficiently treated to proceed to a second cleaning step,
  wherein the first cleaning step is repeated if the judging indicates that the surface of the release layer has not been sufficiently treated to proceed to the second cleaning step, and wherein if the judging indicates that the surface of the release layer has been sufficiently treated to proceed to the second cleaning step, then
  performing the second cleaning step that includes bringing an alkali cleaning agent in contact with the release layer that has been subjected to the first cleaning step,
  measuring an angle of contact with water of a surface of the imprinting mold with the same or different measuring unit, and
  judging with the same or different judgment unit whether or not the angle of contact with water of the surface of the imprinting mold measured bv the same or different measuring unit is not greater than a second reference value that is set less than the first reference value so as to judge whether or not the release layer has been removed,
  wherein the second cleaning step is repeated if the judging indicates that the release layer has not been removed.

16. The process according to claim 15, wherein the first cleaning step includes at least one step selected from the group consisting of a step of irradiating the release layer with light including a wavelength range of less than 190 nm, a step of irradiating the release layer with light including a wavelength range of 190 nm to 370 nm, a step of applying ashing to the release layer, and a step of irradiating the release layer with electron radiation.

17. The process according to claim 16, wherein irradiation of the release layer with light including a wavelength range of less than 190 nm in the first cleaning step is implemented such that a dose of light including a wavelength range of less than 190 nm is within a range of 1 to 10,000 mJ/cm$^2$.

18. The process according to claim 16, wherein irradiation of the release layer with light including a wavelength range of 190 nm to 370 nm in the first cleaning step is implemented such that a dose of light including a wavelength range of 190 nm to 370 nm is in a range of 1 to 100,000 mJ/cm$^2$.

19. The process according to claim 16, wherein the ashing applied to the release layer in the first cleaning step is implemented with at least one species selected from the group consistinpg of active radicals and ions.

20. The process according to claim 19, wherein the ashing applied to the release layer in the first cleaning step is implemented with at least one species selected from the group consisting of oxygen radicals, fluorine radicals, argon radicals, oxygen ions, fluorine ions, argon ions, and ozone.

21. The process according to claim 15, further comprising a moisture removal step prior to the first cleaning step.

22. The process according to claim 15, wherein the first cleaning step includes at least one step selected from the group consisting of a step of irradiating the release layer with electron radiation, and a step of applying ashing by application of at least one species of active radicals and ions from plasma.

23. The process according to claim 22, wherein the at least one species of active radicals and ions from plasma is selected from the group consisting of oxygen radicals, fluorine radicals, argon radicals, oxygen ions, fluorine ions, argon ions, and ozone, generated from oxygen, fluorine, or a mixed gas of an inert gas with oxygen or fluorine.

24. The process according to claim 15, wherein the first reference value is an angle of contact with water of the surface of the release layer of not greater than 95° and the second reference value is an angle of contact with water of the surface of the imprinting mold that is 2° larger than an angle of contact with water of the surface of the imprinting mold before formation of the release layer.

25. A process for manufacturing an imprinting mold comprising a substrate, an uneven structure positioned on one surface of the substrate, and a release layer coupled via siloxane bonds to the substrate in such a way as to cover at least the uneven structure, comprising:
  performing a first cleaning step that includes treating the release layer so as to make a surface of the release layer hydrophilic,
  measuring an angle of contact with water of the surface of the release layer with a measuring unit,
  judging with a judgment unit whether or not the angle of contact with water of the surface of the release layer measured by the measuring unit is not greater than a first reference value so as to judge whether or not the surface of the release layer has been sufficiently treated to proceed to a second cleaning step,
  wherein the first cleaning step is repeated if the judging indicates that the surface of the release layer has not been sufficiently treated to proceed to the second cleaning step, and wherein if the judging indicates that the surface of the release layer has been sufficiently treated to proceed to the second cleaning step, then
  performing the second cleaning step that includes bringing an alkali cleaning agent in contact with the release layer that has been subjected to the first cleaning step,
  measuring an angle of contact with water of a surface of the imprinting mold with the same or different measuring unit, and
  judging with the same or different judgment unit whether or not the angle of contact with water of the surface of the imprinting mold measured by the same or different measuring unit is not greater than a second reference value that is set less than the first reference value so as to judge whether or not the release layer has been removed,
    wherein the second cleaning step is repeated if the judging indicates that the release layer has not been removed.

26. The process according to claim 25, wherein the first cleaning step includes at least one step selected from the group consisting of a step of irradiating the release layer with electron radiation, and a step of applying ashing by application of at least one species of active radicals and ions from plasma.

27. The process according to claim 26, wherein the at least one species of active radicals and ions from plasma is selected from the group consisting of oxygen radicals, fluorine radicals, argon radicals, oxygen ions, fluorine ions, argon ions, and ozone, generated from oxygen, fluorine, or a mixed gas of an inert gas with oxygen or fluorine.

28. The process according to claim 25, wherein the first reference value is an angle of contact with water of the surface of the release layer of not greater than 95° and the second reference value is an angle of contact with water of the surface of the imprinting mold that is 2° larger than an angle of contact with water of the surface of the imprinting mold before formation of the release layer.

29. A process for manufacturing an imprinting mold comprising a substrate, an uneven structure positioned on one surface of the substrate, and a release layer coupled via siloxane bonds to the substrate in such a way as to cover at least the uneven structure, comprising:
    removing the release layer, and
    reforming a fresh release layer coupled via siloxane bonds to the substrate in such a way as to cover at least the uneven structure,
    wherein removal of the release layer comprises:
    performing a first cleaning step that includes treating the release layer so as to reduce an angle of contact with water of a surface of the release layer,
    measuring the angle of contact with water of the surface of the release layer with a measuring unit,
    judging with a judgment unit whether or not the angle of contact with water of the surface of the release layer measured by the measuring unit is not greater than a first reference value so as to judge whether or not the surface of the release layer has been sufficiently treated to proceed to a second cleaning step,
    wherein the first cleaning step is repeated if the judging indicates that the surface of the release layer has not been sufficiently treated to proceed to the second cleaning step, and wherein if the judging indicates that the surface of the release layer has been sufficiently treated to proceed to the second cleaning step, then
    performing the second cleaning step that includes bringing an alkali cleaning agent in contact with the release layer that has been subjected to the first cleaning step,
    measuring an angle of contact with water of a surface of the imprinting mold with the same or different measuring unit, and
    judging with the same or different judgment unit whether or not the angle of contact with water of the surface of the imprinting mold measured by the same or different measuring unit is not greater than a second reference value that is set less than the first reference value so as to judge whether or not the release layer has been removed,
    wherein the second cleaning step is repeated if the judging indicates that the release layer has not been removed.

30. The process according to claim 29, wherein a fluoroalkyl- or alkyl-based silane coupling agent is used in reforming the fresh release layer.

31. The process according to claim 29, wherein the fresh release layer has a thickness of 0.3 to 100 nm.

32. The process according to claim 29, wherein the first cleaning step includes at least one step selected from the group consisting of a step of irradiating the release layer with electron radiation, and a step of applying ashing by application of at least one species of active radicals and ions from plasma.

33. The process according to claim 32, wherein the at least one species of active radicals and ions from plasma is selected from the group consisting of oxygen radicals, fluorine radicals, argon radicals, oxygen ions, fluorine ions, argon ions, and ozone, generated from oxygen, fluorine, or a mixed gas of an inert gas with oxygen or fluorine.

34. The process according to claim 29, wherein the first reference value is an angle of contact with water of the surface of the release layer of not greater than 95° and the second reference value is an angle of contact with water of the surface of the imprinting mold that is 2° larger than an angle of contact with water of the surface of the imprinting mold before formation of the release layer.

35. A process for manufacturing an imprinting mold comprising a substrate, an uneven structure positioned on one surface of the substrate, and a release layer coupled via siloxane bonds to the substrate in such a way as to cover at least the uneven structure, comprising:
    removing the release layer, and
    reforming a fresh release layer coupled via siloxane bonds to the substrate in such a way as to cover at least the uneven structure,
    wherein removal of the release layer comprises:
    a first cleaning step that includes treating the release layer so as to cleave water repellent groups contained in a surface of the release layer,
    measuring an angle of contact with water of the surface of the release layer with a measuring unit,
    judging with a judgment unit whether or not the angle of contact with water of the surface of the release layer measured by the measuring unit is not greater than a first reference value so as to judge whether or not the surface of the release layer has been sufficiently treated to proceed to a second cleaning step,
    wherein the first cleaning step is repeated if the judging indicates that the surface of the release layer has not been sufficiently treated to proceed to the second cleaning step, and wherein if the judging indicates that the surface of the release layer has been sufficiently treated to proceed to the second cleaning step, then
    performing the second cleaning step that includes bringing an alkali cleaning agent in contact with the release layer that has been subjected to the first cleaning step,
    measuring an angle of contact with water of a surface of the imprinting mold with the same of different measuring unit, and
    judging with the same or different judgment unit whether or not the angle of contact with water of the surface of the imprinting mold measured by the same or different measuring unit is not greater than a second reference value that is set less than the first reference value so as to judge whether or not the release layer has been removed,
    wherein the second cleaning step is repeated if the judging indicates that the release layer has not been removed.

36. The process according to claim 35, wherein a fluoroalkyl- or alkyl-based silane coupling agent is used in reforming the fresh release layer.

37. The process according to claim 35, wherein the fresh release layer has a thickness of 0.3 to 100 nm.

38. The process according to claim 35, wherein the first cleaning step includes at least one step selected from the group consisting of a step of irradiating the release layer with electron radiation, and a step of applying ashing by application of at least one species of active radicals and ions from plasma.

39. The process according to claim 38, wherein the at least one species of active radicals and ions from plasma is selected from the group consisting of oxygen radicals, fluorine radicals, argon radicals, oxygen ions, fluorine ions, argon ions, and ozone, generated from oxygen, fluorine, or a mixed gas of an inert gas with oxygen or fluorine.

40. The process according to claim 35, wherein the first reference value is an angle of contact with water of the surface of the release layer of not greater than 95° and the second reference value is an angle of contact with water of the surface of the imprinting mold that is 2° larger than an angle of contact with water of the surface of the imprinting mold before formation of the release layer.

* * * * *